(12) United States Patent
Magnusson et al.

(10) Patent No.: US 12,126,311 B2
(45) Date of Patent: Oct. 22, 2024

(54) PROCESSING AUDIO WITH AN AUDIO PROCESSING OPERATION

(71) Applicant: Nokia Technologies Oy, Espoo (FI)

(72) Inventors: Birgir Magnusson, Sipoo (FI); Koray Ozcan, Farnborough (GB)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 17/458,858

(22) Filed: Aug. 27, 2021

(65) Prior Publication Data

US 2021/0398553 A1 Dec. 23, 2021

Related U.S. Application Data

(63) Continuation of application No. 16/451,079, filed on Jun. 25, 2019, now Pat. No. 11,127,415, which is a
(Continued)

(51) Int. Cl.
*H03G 1/02* (2006.01)
*G10L 25/75* (2013.01)
*G11B 27/038* (2006.01)
*H04N 5/765* (2006.01)
*H04N 9/806* (2006.01)
(Continued)

(52) U.S. Cl.
CPC ............... *H03G 1/02* (2013.01); *G10L 25/75* (2013.01); *G11B 27/038* (2013.01); *H04N 5/765* (2013.01); *H04N 9/806* (2013.01); *H04S 7/00* (2013.01); *H04N 21/47* (2013.01); *H04R 1/406* (2013.01); *H04R 3/005* (2013.01)

(58) Field of Classification Search
CPC .... H04N 5/44504; H04N 21/47; H04N 5/765; H04N 9/806; G10L 25/75; G11B 27/038; H04R 1/406; H04R 3/005; H03G 1/02; H04S 7/00
USPC .......... 381/104, 74, 334, 333, 123; 715/727, 715/728, 716; 704/276
See application file for complete search history.

(56) References Cited

U.S. PATENT DOCUMENTS 5,852,800 A 12/1998 Modeste
2001/0024233 A1 9/2001 Urisaka et al.
(Continued)

FOREIGN PATENT DOCUMENTS

EP 1257146 11/2002
GB 2416948 2/2006
(Continued)

OTHER PUBLICATIONS

Bill Meyers (username Guerillabill on youtube), "Affordable Wireless Microphone for your camcorder lavalier" htpp://www.youtube.com/watch?v+uYlhDRrw_eA, uploaded on Feb. 26, 2008. (Note: Reference not provided as this is a link to youtube).
(Continued)

*Primary Examiner* — Vivian C Chin
*Assistant Examiner* — Douglas J Suthers
(74) *Attorney, Agent, or Firm* — Harrington & Smith

(57) ABSTRACT

An apparatus or method to allow a user to control an audio processing operation of an internal and/or external microphone(s). The method includes providing a configurable user interface which enables mixing of audio signals through interaction with the user interface. The audio signals may be captured with internal or external microphones.

18 Claims, 13 Drawing Sheets

Related U.S. Application Data continuation of application No. 13/883,610, filed as application No. PCT/IB2010/055142 on Nov. 12, 2010, now Pat. No. 11,120,818.

(51) Int. Cl.
| | | |
|---|---|---|
| *H04N 21/47* | (2011.01) |
| *H04R 1/40* | (2006.01) |
| *H04R 3/00* | (2006.01) |
| *H04S 7/00* | (2006.01) |

(56) References Cited

U.S. PATENT DOCUMENTS

| | | | |
|---|---|---|---|
| 2002/0109710 A1* | 8/2002 | Holtz | G11B 27/034 |
| 2004/0030425 A1* | 2/2004 | Yeakel | H04H 60/04 |
| | | | 381/119 |
| 2009/0076816 A1 | 3/2009 | Bradford et al. | |
| 2009/0238377 A1* | 9/2009 | Ramakrishnan | H04R 3/005 |
| | | | 381/92 |
| 2010/0123785 A1 | 5/2010 | Chen et al. | |
| 2010/0272297 A1 | 10/2010 | Boretzki | |
| 2010/0303261 A1 | 12/2010 | Stieler von Heydekampf | |
| 2011/0013075 A1 | 1/2011 | Kim | |
| 2011/0311083 A1 | 12/2011 | Bennett | |

FOREIGN PATENT DOCUMENTS

| | | |
|---|---|---|
| WO | WO-97/33450 A1 | 9/1997 |
| WO | WO-2008025858 | 3/2008 |
| WO | WO-2010/120855 A1 | 10/2010 |

OTHER PUBLICATIONS

Anonymous: "Change Sound Input Source on Mac with Option-Click on Sound Menu", Sep. 28, 2009 (Sep. 28, 2009) XP055575447, Retrieved from the Internet: URL: http://osxdaily.com/2009/09/28/option-click-sound-menu-to-change-input-source/ [retrieved on Mar. 28, 2019].

\* cited by examiner

PROCESSING AUDIO WITH AN AUDIO PROCESSING OPERATION

RELATED APPLICATION

This application is a continuation of U.S. patent application Ser. No. 16/451,079, filed Jun. 25, 2019, which is a continuation of U.S. patent application Ser. No. 13/883,610, filed May 6, 2013, which is a National Stage Entry of International Application No. PCT/IB2010/055142, filed Nov. 12, 2010. Each of these applications is hereby incorporated by reference in their entirety.

FIELD OF THE APPLICATION

The present invention relates to apparatus for processing of audio signals. The invention further relates to, but is not limited to, apparatus for processing audio and speech signals in portable devices.

SUMMARY OF THE APPLICATION

In telecommunications apparatus, a microphone or microphone array is typically used to capture the acoustic waves and output them as electronic signals representing audio or speech which then may be processed and transmitted to other devices or stored for later playback. Currently technologies permit the use of more than one microphone within a microphone array to capture the acoustic waves, and the resultant audio signal from each of the microphones may be passed to an audio processor to assist in Isolating a wanted acoustic wave.

Furthermore video and audio recording (or capture) in electronic devices other than dedicated cameras is becoming popular. As image recording quality progressively increases on such electronic devices, they are used for more than amateur recording of events such as music concerts, family events, interviews etc. which would have previously required the use of dedicated audio and video recording apparatus, for example the film "The Commuter" was shot on a NOKIA N8.

Typical video recording capability on mobile apparatus enables a user to adjust the image quality or change the camera quickly so that a user may zoom in or out (using either a digital or optical or a combination of digital and optical zooming technology) or may change other recording parameters such as flash, image brightness or contrast, etc. The result of changing of any of these parameters can be clearly seen by the user in such implementations and as such poor quality video capture can be quickly caught and the parameters adjusted to produce an improved recording. However, audio recording capability has not followed these improvements.

Typically the user or operator of audio recording apparatus is not technically aware of the sound properties being recorded and thus may not be aware of the sound levels or in which direction the sound is coming from and thus may not catch when a poor or inaccurate audio recording is in progress and therefore may be unable to select or adjust the recording capability of the device to improve the recording. Furthermore even when apparatus has been designed to provide some assistance to the user, it often is displayed in a form which the user is unable to interact with.

Furthermore the audio recording apparatus/video recording apparatus is typically built with the microphone or microphone array integral with the device. Where the sound source is at some distance and where the capture or recording is occurring in an environment which is noisy then the audio can be muffled or completely lost.

In some circumstances moving the microphone (for example a microphone located within the device) to attempt to improve the audio quality can be problematic for the recording the video or image of the source. Although in some circumstances a recording can be improved by using external directional microphones to provide a directional recording beam, an inexperienced operator could select a poor quality external microphone or captured audio signal over the captured audio signal produced from the electronic device due to lack of or poor quality information. Furthermore control of external microphone/audio capture apparatus is typically limited and is difficult to integrate with integral apparatus microphone/audio capture apparatus.

This invention proceeds from the consideration that information about external microphones or microphones external to the apparatus can assist the apparatus in the control of audio recording and thus, for example assist in the reduction of noise of the captured audio signals by audio microphone selection and balancing.

SUMMARY OF VARIOUS EXAMPLES

Embodiments of the present invention aim to address the above problem.

There is provided according to a first aspect of the application there is provided a method comprising: determining at least one audio source; generating a visual representation associated with the at least one audio source; and processing an audio signal associated with the at least one audio source dependent on interaction with the visual representation.

The visual representation may comprise at least one of: a visual representation of the at least one audio source; a visual representation of the type of audio source; a visual representation of the coupling between the audio source and an apparatus; a visual representation of at least one parameter associated with the audio source.

The visual representation of the type of audio source may comprise at least one of: a visual representation of a microphone integral with an apparatus; a visual representation of a microphone physically separate to an apparatus; a visual representation of a microphone array; a visual representation of a broadcast audio source; a visual representation of a FM broadcast audio source; a visual representation of a T-coil broadcast audio source; and a visual representation of a near field communication (NFC) audio source.

The visual representation of the coupling between the audio source and an apparatus may comprise at least one of: a visual representation of a physical coupling between the audio source and the apparatus; a visual representation of a wireless coupling between the audio source and the apparatus; a visual representation of a BLUETOOTH short-range wireless coupling between the audio source and the apparatus; a visual representation of a NFC coupling between the audio source and the apparatus; and a visual representation of a T-coil coupling between the audio source and the apparatus.

The visual representation of at least one parameter associated with the audio source may comprise at least one of: a visual representation of an audio source status; a visual representation of an audio source gain; a visual representation of an audio source filtering; and a visual representation of mixing between at least two audio sources.

The method may further comprise: sensing a position of the at least one audio source; and displaying the visual representation dependent on the position of the at least one audio source.

The method may further comprise interacting with the visual representation of the audio source.

Interacting with the visual representation of the audio source may comprise at least one of: selecting the visual representation; and moving the visual representation on the display.

Processing an audio signal associated with the at least one audio source may comprise at least one of: switching the audio signal; filtering the audio signal; and amplifying the audio signal.

Filtering the audio signal may comprise at least one of: frequency filtering the audio signal; time filtering the audio signal; and spatial filtering the audio signal.

According to a second aspect there is provided an apparatus comprising at least one processor and at least one memory including computer program code the at least one memory and the computer program code configured to, with the at least one processor, cause the apparatus at least to perform: determining at least one audio source; generating a visual representation associated with the at least one audio source; and processing an audio signal associated with the at least one audio source dependent on interaction with the visual representation.

Generating the visual representation may cause the apparatus to perform at least one of: a visual representation of the at least one audio source; a visual representation of the type of audio source; a visual representation of the coupling between the audio source and an apparatus; and a visual representation of at least one parameter associated with the audio source.

The visual representation of the type of audio source may comprise at least one of: a visual representation of a microphone integral with an apparatus; a visual representation of a microphone physically separate to an apparatus; a visual representation of a microphone array; a visual representation of a broadcast audio source; a visual representation of a FM broadcast audio source; a visual representation of a T-coil broadcast audio source; and a visual representation of a near field communication (NFC) audio source.

The visual representation of the coupling between the audio source and an apparatus may comprise at least one of: a visual representation of a physical coupling between the audio source and the apparatus; a visual representation of a wireless coupling between the audio source and the apparatus; a visual representation of a BLUETOOTH short-range wireless coupling between the audio source and the apparatus; a visual representation of a NFC coupling between the audio source and the apparatus; and a visual representation of a T-coil coupling between the audio source and the apparatus.

The visual representation of at least one parameter associated with the audio source may comprise at least one of: a visual representation of an audio source status; a visual representation of an audio source gain; a visual representation of an audio source filtering; and a visual representation of mixing between at least two audio sources.

The apparatus may further perform: sensing a position of the at least one audio source; and displaying the visual representation dependent on the position of the at least one audio source.

The apparatus may further perform interacting with the visual representation of the audio source.

Interacting with the visual representation of the audio source may further cause the apparatus to perform at least one of: selecting the visual representation; and moving the visual representation on the display.

Processing an audio signal associated with the at least one audio source may cause the apparatus to perform at least one of: switching the audio signal; filtering the audio signal; and amplifying the audio signal.

Filtering the audio signal may further cause the apparatus to perform at least one of: frequency filtering the audio signal; time filtering the audio signal; and spatial filtering the audio signal.

According to a third aspect of the application there is provided an apparatus comprising: an audio source determiner configured to determine at least one audio source; a visualizer configured to generate a visual representation associated with the at least one audio source; and a controller configured to process an audio signal associated with the at least one audio source dependent on interaction with the visual representation.

The visualizer may be configured to generate the visual representation comprising at least one of: a visual representation of the at least one audio source; a visual representation of the type of audio source; a visual representation of the coupling between the audio source and an apparatus; a visual representation of at least one parameter associated with the audio source.

The visual representation of the type of audio source may comprise at least one of: a visual representation of a microphone integral with an apparatus; a visual representation of a microphone physically separate to an apparatus; a visual representation of a microphone array; a visual representation of a broadcast audio source; a visual representation of a FM broadcast audio source; a visual representation of a T-coil broadcast audio source; and a visual representation of a near field communication (NFC) audio source.

The visual representation of the coupling between the audio source and an apparatus may comprise at least one of: a visual representation of a physical coupling between the audio source and the apparatus; a visual representation of a wireless coupling between the audio source and the apparatus; a visual representation of a BLUETOOTH short-range wireless coupling between the audio source and the apparatus; a visual representation of a NFC coupling between the audio source and the apparatus; and a visual representation of a T-coil coupling between the audio source and the apparatus.

The visual representation of at least one parameter associated with the audio source may comprise at least one of: a visual representation of an audio source status; a visual representation of an audio source gain; a visual representation of an audio source filtering; and a visual representation of mixing between at least two audio sources.

The apparatus may further comprise: at least one sensor configured to locate the at least one audio source; and a display configured to display the visual representation dependent on the position of the at least one audio source.

The apparatus may further comprise a user interface input configured to interact with the visual representation of the audio source.

The user interface input configured to interact with the visual representation of the audio source may comprise at least one of: a selector input determiner configured to determine a selection of the visual representation; and a motion input determiner configured to determine a moving of the visual representation.

The user interface input may comprise at least one of: a touch screen interface; a keypad; a keyboard; a touchpad; and a mouse.

The controller may comprise at least one of: a switch configured to switch the audio signal; a filter configured to filter the audio signal; and an amplifier configured to amplify the audio signal.

The filter may comprise at least one of: a frequency domain filter; a time domain filter; and a spatial domain filter.

According to a fourth aspect of the application there is provided apparatus comprising: means for determining at least one audio source; means for generating a visual representation associated with the at least one audio source; and means for processing an audio signal associated with the at least one audio source dependent on interaction with the visual representation.

The visual representation may comprise at least one of: a visual representation of the at least one audio source; a visual representation of the type of audio source; a visual representation of the coupling between the audio source and an apparatus; a visual representation of at least one parameter associated with the audio source.

The visual representation of the type of audio source may comprise at least one of: a visual representation of a microphone integral with an apparatus; a visual representation of a microphone physically separate to an apparatus; a visual representation of a microphone array; a visual representation of a broadcast audio source; a visual representation of a FM broadcast audio source; a visual representation of a T-coil broadcast audio source; and a visual representation of a near field communication (NFC) audio source.

The visual representation of the coupling between the audio source and an apparatus may comprise at least one of: a visual representation of a physical coupling between the audio source and the apparatus; a visual representation of a wireless coupling between the audio source and the apparatus; a visual representation of a BLUETOOTH short-range wireless coupling between the audio source and the apparatus; a visual representation of a NFC coupling between the audio source and the apparatus; and a visual representation of a T-coil coupling between the audio source and the apparatus.

The visual representation of at least one parameter associated with the audio source may comprise at least one of: a visual representation of an audio source status; a visual representation of an audio source gain; a visual representation of an audio source filtering; and a visual representation of mixing between at least two audio sources.

The apparatus may further comprise: means for sensing a position of the at least one audio source; and means for displaying the visual representation dependent on the position of the at least one audio source.

The apparatus may further comprise means for interacting with the visual representation of the audio source.

The means for interacting with the visual representation of the audio source may comprise at least one of: means for selecting the visual representation; and means for moving the visual representation on the display.

The means for processing an audio signal associated with the at least one audio source may comprise at least one of: means for switching the audio signal; means for filtering the audio signal; and means for amplifying the audio signal.

The means for filtering the audio signal may comprise at least one of: means for frequency filtering the audio signal; means for time filtering the audio signal; and means for spatial filtering the audio signal.

An electronic device may comprise apparatus as described above.

A chipset may comprise apparatus as described above.

BRIEF DESCRIPTION OF DRAWINGS

For better understanding of the present invention, reference will now be made by way of example to the accompanying drawings in which.

EMBODIMENTS OF THE APPLICATION

Figure 1:
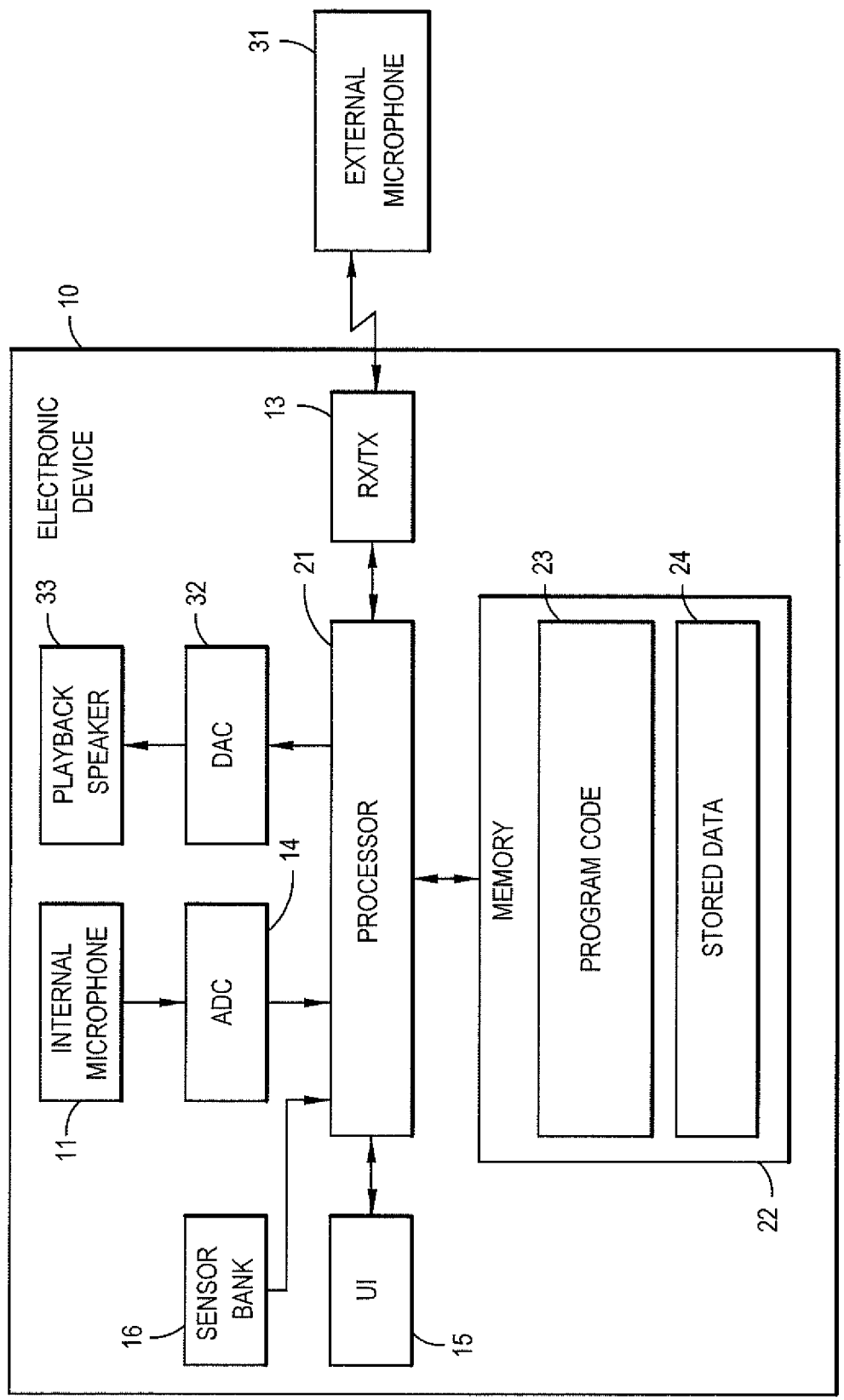
FIG. 1 shows schematically an apparatus employing embodiments of the application.

The following describes apparatus and methods for the provision of enhancing video and/or audio capture and recording flexibility using external microphones. In this regard reference is first made to FIG. 1 which shows a schematic block diagram of an exemplary electronic device 10 or apparatus, which may incorporate enhanced signal capture performance components and methods.

The apparatus 10 can for example be a mobile terminal or user equipment for a wireless communication system. In some other embodiments the apparatus can be any audio player, such as an mp3 player or media player, equipped with suitable microphone and sensors as described below.

The apparatus 10 in some embodiments comprises a processor 21. The processor 21 may be configured to execute various program codes. The implemented program codes may comprise audio capture/recording enhancement code.

The implemented program codes can in some embodiments be stored for example in the memory 22 for retrieval by the processor 21 whenever needed. The memory 22 in some embodiments can provide a program code section 23 for the storage of the program codes. The memory 22 in some further embodiments could further provide a data storage section 24 for storing data, for example data that has been processed in accordance with the embodiments.

The audio capture/recording enhancement code may in embodiments be implemented at least partially in hardware or firmware.

The processor 21 can in some embodiments be linked via a digital-to-analogue converter (DAC) 32 to a playback speaker 33.

The digital to analogue converter (DAC) 32 can be any suitable converter.

The playback speaker 33 can, for example, be any suitable audio transducer equipment suitable for producing acoustic waves for the user's ears generated from the electronic audio signal output from the DAC 32. The playback speaker 33 in some embodiments can be a headset or playback speaker and can be connected to the electronic device 10 via a headphone connector. In some embodiments the speaker 33 can comprise the DAC 32. Furthermore in some embodiments the speaker 33 can connect to the apparatus 10 wirelessly, for example by using a low power radio frequency connection such as demonstrated by the BLUETOOTH short-range wireless A2DP profile. As described herein the connection implemented by the wireless connection may be managed by the transceiver 13 in some embodiments of the application.

The processor 21 in some embodiments can be further linked to a transceiver (TX/RX) 13, to a user interface (UI) 15 and to a memory 22.

The user interface 15 can in some embodiments enable a user to input commands to the apparatus 10, for example via a keypad, and/or to obtain information from the apparatus 10, for example via a display (not shown). It would be understood that the user interface can furthermore in some embodiments be any suitable combination of input and display technology, for example a touch screen display suitable for both receiving inputs from the user and displaying information to the user.

The transceiver 13, can be any suitable communication technology and be configured to enable communication with other electronic devices, for example via a wireless communication network.

The apparatus 10 can in some embodiments further comprise at least one integral microphone or microphone array 11 for inputting or capturing acoustic waves and outputting audio or speech signals to be processed according to embodiments of the application. The audio or speech signals can according to some embodiments be transmitted to other electronic devices via the transceiver 13 or can be stored in the data section 24 of the memory 22 for later processing.

A corresponding program code or hardware to control the capture of audio signals using the at least two microphones can be activated to this end by the user via the user interface 15.

The apparatus 10 in some embodiments can further comprise an analogue-to-digital converter (ADC) 14 configured to convert the input analogue audio signals from the microphone 11 into digital audio signals and provide the digital audio signals to the processor 21.

The apparatus 10 may in some embodiments receive the audio signals from a microphone not implemented physically on the electronic device. For example the speaker 33 apparatus in some embodiments may comprise an external microphone array. In some embodiments the apparatus 10 can receive the audio signals from at least one external microphone, such as external microphone 31 shown in FIG. 1. The external microphone 31 can then in some embodiments transmit the audio signals from the external microphone 31. In some embodiments the external microphone 31 could be an integral microphone implemented in a further apparatus or another electronic device. The external microphone 31 in some embodiments can be wirelessly coupled to the apparatus 10 for example via a suitable wireless protocol, such as for example a BLUETOOTH short-range wireless channel, a Wi-Fi channel, a magnetic loop channel (such as a T-coil reception), or low power FM channel. In some embodiments the external microphone can be coupled to the apparatus via a wired connection, for example via the physical socket and plug connection. Thus for example an external microphone or external source could be in some embodiments an audio source broadcasted on a FM frequency (such as the Obama inauguration, or a FM radio station) and received by the apparatus FM receiver which as described herein could be added as an alternative audio input. Furthermore in some embodiments the external source could be in some embodiments an mp3 format audio source being transmitted using a near field communication (NFC) format from an 'intelligent' billboard advertising a new single from an artist.

In some embodiments, the processor 21 may execute the audio capture/recording enhancement program code stored in the memory 22. The processor 21 in these embodiments may process the received audio signal data, and output or store the processed audio data.

The received audio data can in some embodiments be stored, instead of being processed immediately, in the data section 24 of the memory 22, for instance for later processing and presentation or forwarding to still another apparatus or electronic device.

Furthermore the apparatus can in some embodiments comprise sensors or a sensor bank 16. The sensor bank 16 can in such embodiments receive information about the environment in which the apparatus 10 is operating and pass this information to the processor 21 in order to affect the processing of the audio signal and in particular to affect the processor 21 in audio capture/recording applications. The sensor bank 16 can in such embodiments comprise at least one of the following set of sensors.

The sensor bank 16 can in some embodiments comprise a camera module. The camera module can in some embodiments comprise at least one camera having a lens for focusing an image on to a digital image capture means such as a charged coupled device (CCD). In some other embodiments the digital image capture means can be any suitable image capturing device such as complementary metal oxide semiconductor (CMOS) image sensor. The camera module can further comprise in some embodiments a flash lamp for illuminating an object before capturing an image of the object. The flash lamp is in such embodiments linked to a camera processor for controlling the operation of the flash lamp. In other embodiments the camera may be configured to perform infra-red and near infra-red sensing for low ambient light sensing. The camera can be also linked to the camera processor for processing signals received from the at least one camera before passing the processed image to the processor. The camera processor can in some embodiments be linked to a local camera memory which can store program codes for the camera processor to execute when capturing an image. Furthermore the local camera memory can in such embodiments be used in some embodiments as a buffer for storing the captured image before and during local processing. In some embodiments the camera processor and the camera memory are implemented within the processor 21 and memory 22 respectively.

Furthermore in some embodiments the camera module may be physically implemented separate from the apparatus and coupled to the apparatus either wirelessly or by physical connection. For example in some embodiments the camera module can be implemented as part of a combined playback speaker/external microphone/cameral module apparatus to be worn on the head.

In some embodiments the sensor bank 16 comprises a position/orientation sensor. The orientation sensor in some embodiments can be implemented by a digital compass or solid state compass configured to determine the apparatus orientation with respect to the horizontal axis. In some embodiments the position/orientation sensor can be a gravity sensor configured to output the apparatus's orientation with respect to the vertical axis. The gravity sensor for example can be implemented as an array of mercury switches set at various angles to the vertical with the output of the switches indicating the angle of the apparatus with respect to the vertical axis. In some other embodiments the position/orientation sensor is an accelerometer or gyroscope. In other words in some embodiments there can comprise means for sensing a position of a determined at least one audio source.

It is to be understood again that the structure of the apparatus 10 could be supplemented and varied in many ways.

Figure 2:
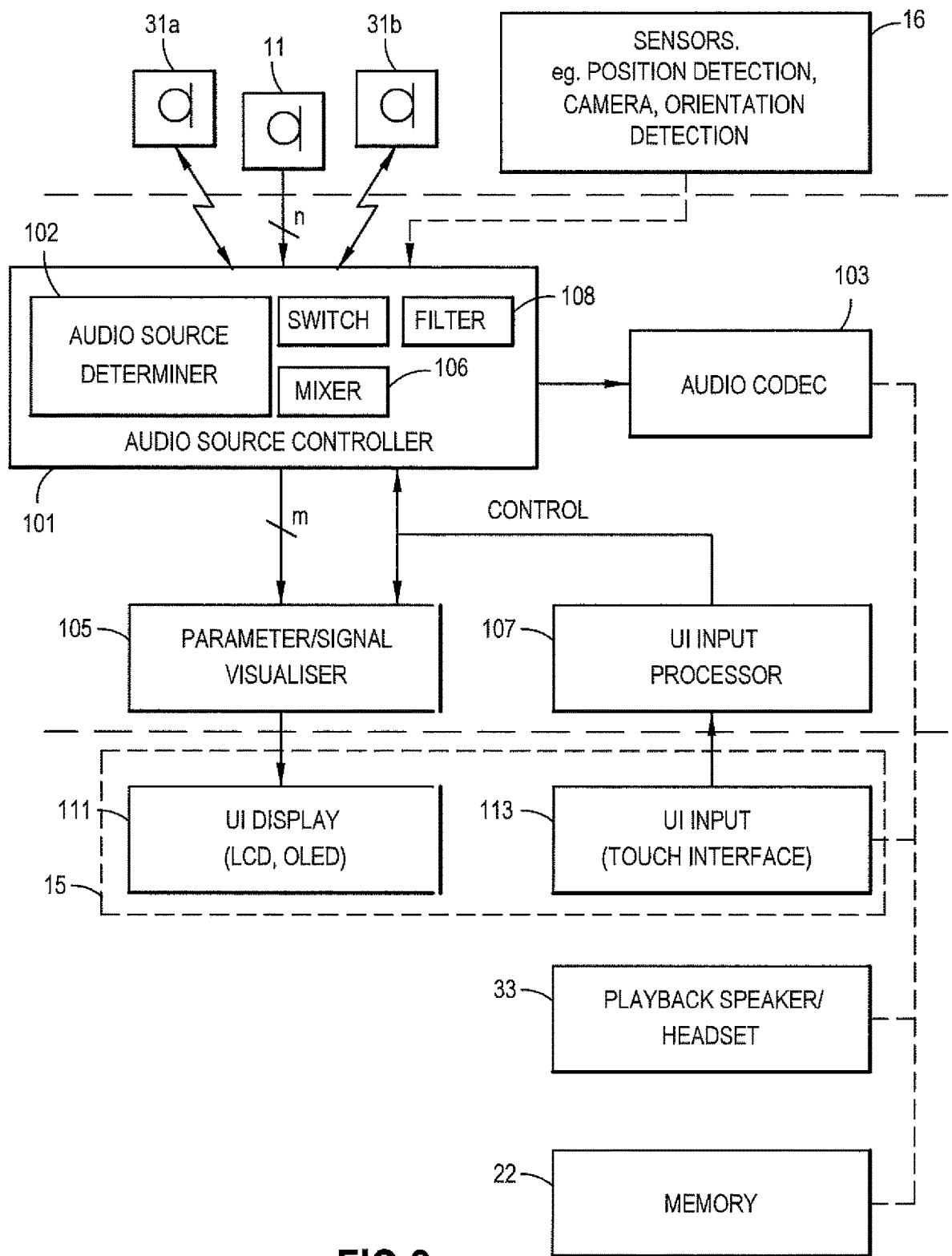
FIG. 2 shows schematically the apparatus shown in FIG. 1 in further detail.
Figure 10:
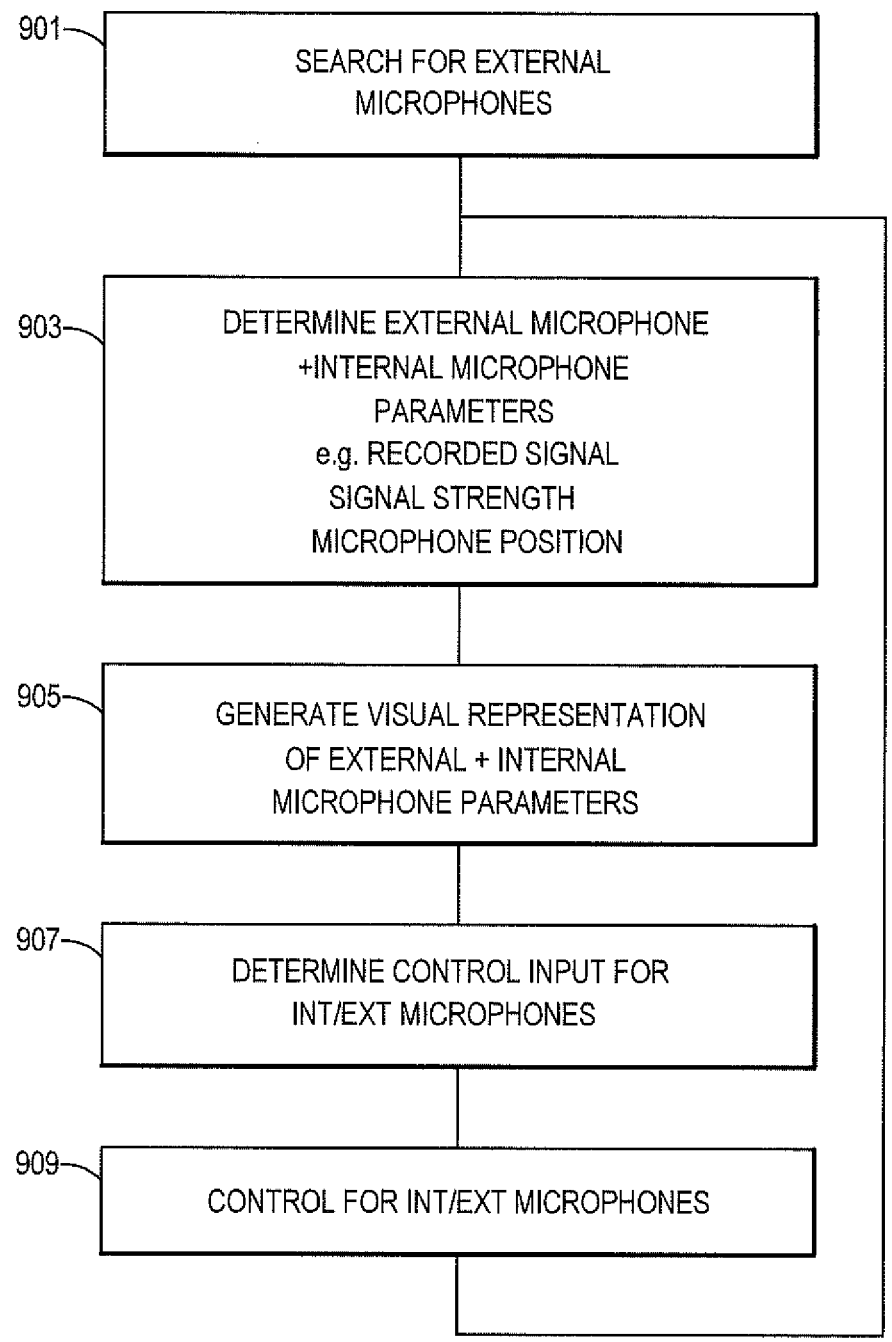
FIG. 10 shows an overview of the operation of embodiments of the application.

It would be appreciated that the schematic structures described in FIG. 2 and the method steps in FIG. 10 represent only a part of the operation of a complete audio capture/recording chain comprising some embodiments as exemplarily shown implemented in the apparatus shown in FIG. 1.

With respect to FIG. 2 some embodiments of the application as implemented and operated are shown in further detail.

Furthermore with respect to FIG. 10, there is a flow chart showing a series of operations which may be employed in some embodiments of the application.

In some embodiments the apparatus provides a user or operator of an apparatus an interactive flexible audio and/or audio visual recording solution. The user interface 15 can in these embodiments provide the user the information required from the recorded audio signals by measuring and displaying the sound field in real time so that the operator or user of the apparatus can determine what is being recorded. Furthermore in some embodiments, using the same user interface the operator of the apparatus can also adjust parameters in real time and thus adjust the recorded sound field and so avoid recoding or capturing poor quality audio signals.

The apparatus in some embodiments as described previously comprises at least one microphone. As shown in FIG. 2 the following examples show an internal microphone 11 coupled to the apparatus using a physical coupling, for example an internal coupling between the microphone 11 and processor (via in some embodiments by a suitable analogue to digital convertor). It would be understood that in some other embodiments there can be apparatus with multiple internal microphones or a steerable array of microphones which can be controlled by the user using the visualizer described herein.

Furthermore as shown in FIG. 2, these examples show two external microphones, a first external microphone 31*a* coupled wirelessly to the apparatus 10 and a second external microphone 31*b* also coupled wirelessly to the apparatus. Although two external microphones and one internal microphone are shown in this example it would be understood that in some embodiments any suitable number of microphones can be 'displayed' and 'controlled', and that the microphones can be wirelessly or physically coupled to the apparatus in any suitable combination of microphones. For example in some embodiments at least some of the external microphones can be implemented on a supporting structure, such as a NH905 NOKIA headset which is equipped with 10 microphones, which could be detected displayed and controlled as described herein and permit surround sound recording.

In some embodiments the apparatus 10 comprises an audio source controller 101. The audio source controller 101 can be any suitable means for controlling the various audio sources such as the internal microphone 11, external microphone 31, and in some embodiments pre-stored audio sources. An audio source can be described as any suitable source of audio information and can in some embodiments be a device or apparatus away from the original acoustic sources, for example an external microphone can in some embodiments be an audio source suitable for capturing the audio waves generated from an acoustic source such as a subject being interviewed or a choir singing.

In some embodiments the audio source controller 101 can comprise an audio source determiner 102 configured to determine/search for audio sources. In some embodiments the audio source determiner 102 is configured to determine whether there are any external microphones or audio sources which can be suitably coupled to the apparatus 10.

Furthermore in some embodiments the audio source determiner 102 can be configured to inquire or determine the status of each of the detected external microphone or audio sources. For example in some embodiments the audio source determiner 102 can be configured to determine an external microphone plug having been inserted into a suitable apparatus. In some other embodiments the audio source determiner 102 can be configured to determine (or detect) any suitable wireless coupling external microphones are in range and initialise a coupling or handshaking such that the external microphone is configured to be able to send audio signals to the apparatus. In some further embodiments the audio source determiner 102 can be configured to operate the transceiver 13 such that any 'in range' wireless audio source is detected, for example a FM audio source, a magnetic loop audio source or Wi-Fi audio source, and then the transceiver 13 is controlled to receive or 'tune in' to the audio source.

The operation of searching for audio sources or external microphones is shown in FIG. 10 by step 901.

The audio source controller 101 in some embodiments furthermore can receive from the sensors 16 further information which can be associated with each of the audio sources. For example for an external microphone 31 the sensors 16 in some embodiments can be configured to determine the location and orientation of the external microphone relative to the apparatus. In other words in at least one embodiment there can comprise a means for determining at least one audio source. Furthermore in such embodiments for example equipped with multiple or 3D cameras the location or position of audio sources could be estimated with respect to the space or environment surrounding the apparatus.

In some embodiments the audio source controller 101, can receive information associated with each determined (or detected) audio source from the audio source. For example in some embodiments the external microphone 31 can transmit with the audio signal an estimate of the external microphone 31 position and orientation. In such embodiments the audio source controller 101 can compare the received information to the apparatus information generated by the sensors 16. For example a relative distance and orientation from the apparatus can be estimated in such a manner. In some other embodiments the external microphone 31 or audio source can broadcast a beacon signal which can be detected by the sensors and used to produce an estimate of the location of the external microphone. For example the external microphone 31 can be configured to output an infra-red beacon detected by the camera and enabling a visual label as described herein to be associated with and overlaid on the visual image.

The information determined with or associated with each microphone can be any suitable information such as but not exclusively: microphone status (on, off, standby); microphone status (receiving audio signals, transmitting/passing audio signals); microphone movable/static; microphone position; microphone orientation, microphone fault determination; microphone type; microphone available connectivity; and microphone signal strength.

The operation of determining microphone information or parameter values for internal and/or external microphones is shown in FIG. 10 by step 903.

The apparatus 10 furthermore can in some embodiments comprise a parameter/signal visualiser 105. The parameter/signal visualiser 105 can in some embodiments receive the parameter settings associated with each of the determined microphones and further in some embodiments the audio signals associated with each determined microphone and determine or generate representations associated with each of the audio sources in a form suitable for being displayed. The parameter/signal visualiser 105 can thus in some embodiments determine or generate representations for the audio signals associated with the external microphones or internal microphones being received or detected at the apparatus. These representations can for example be representations associated with the audio source such as for example identifying whether the audio source is internal or external to the apparatus, further distinguishing between the types of audio source such as but not exclusively a single microphone, multiple microphones or an array of microphones, a FM audio stream, an internally stored audio stream such an mp3 internal audio signal, a NFC audio stream, and a T-coil audio stream. Furthermore in some embodiments the representations can be associated with the audio signal such as for example a time domain representation or frequency domain representation or the audio signal, a representation of the signal strength (or signal power), a representation of the relative position of the microphone/audio source to the apparatus, a representation of the microphone/audio source beam orientation, a representation of the status of the audio source (whether the microphone is switched on, off, or standby), a representation of the microphone gain, and a representation of any filtering applied to audio signal. Thus in at least one embodiment there can comprise a means for generating a visual representation associated with the at least one audio source.

The visual representation can in at least one embodiment and as described herein comprise at least one of: a visual representation of the at least one audio source; a visual representation of the type of audio source; a visual representation of the coupling between the audio source and an apparatus; a visual representation of at least one parameter associated with the audio source. Furthermore as described herein the visual representation of the type of audio source can comprise at least one of: a visual representation of a microphone integral with an apparatus; a visual representation of a microphone physically separate to an apparatus; a visual representation of a microphone array; a visual representation of a broadcast audio source; a visual representation of a FM broadcast audio source; a visual representation of a T-coil broadcast audio source; and a visual representation of a near field communication (NFC) audio source. Similarly in some embodiments as described herein the visual representation of the coupling between the audio source and an apparatus may comprise at least one of: a visual representation of a physical coupling between the audio source and the apparatus; a visual representation of a wireless coupling between the audio source and the apparatus; a visual representation of a BLUETOOTH short-range wireless coupling between the audio source and the apparatus; a visual representation of a NFC coupling between the audio source and the apparatus; and a visual representation of a T-coil coupling between the audio source and the apparatus. Also in some embodiments the visual representation of at least one parameter associated with the audio source may comprise at least one of: a visual representation of an audio source status; a visual representation of an audio source gain; a visual representation of an audio source filtering; and a visual representation of mixing between at least two audio sources.

The parameter/signal visualizer 105 can be configured to furthermore pass the visual representations to the user interface 15 and in particular the user interface display 111.

The operation of generating visual representations associated with the internal and external microphone audio signals is shown in FIG. 10 by step 905.

Figure 3:
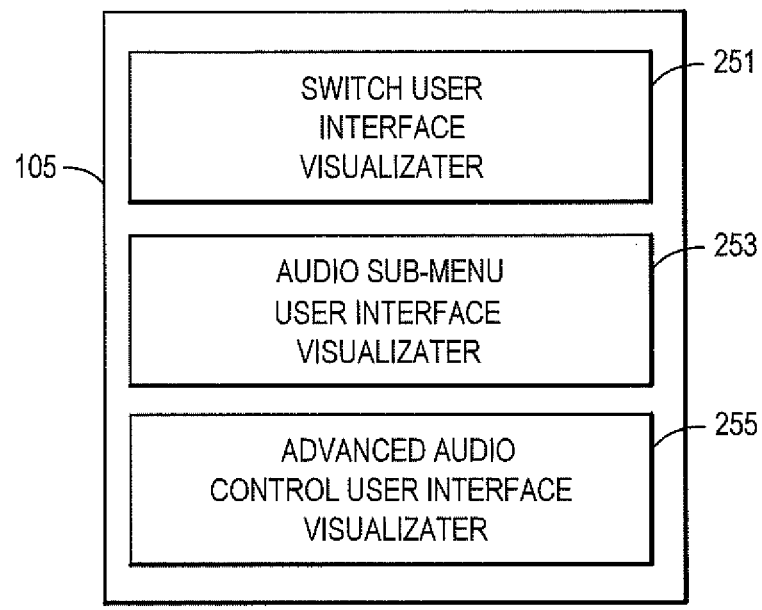
FIG. 3 shows schematically the parameter visualizer shown in FIG. 2 in further detail.

With respect to FIG. 3, the parameter/signal visualizer 105 is shown in further detail. The parameter/signal visualizer 105 can in some embodiments comprise a switch user interface visualizer 251. The switch user interface visualizer 251 can in some embodiments be configured to generate a visual representation of an audio source (for example an internal or external microphone) and so enable a switching operation to be carried out.

Figure 6:
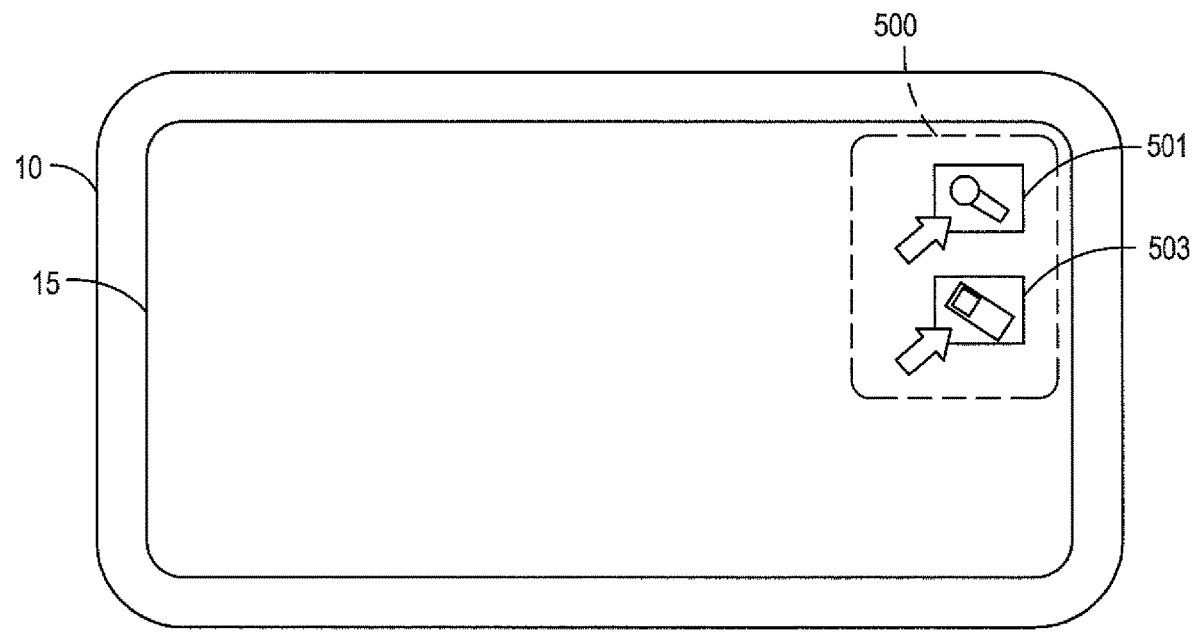
FIG. 6 shows an example of a switch user interface configuration according to some embodiments.

With respect to FIG. 6 an example visual representation for switching user interface operations can be shown. The apparatus 10 as shown in FIG. 1 with a user interface 15 in the form of a touch screen display. The switch user interface visualizer 251 can be configured to receive information on which audio sources are available and/or active and suitable for transmitting and generate on a region 500 of the touch screen display iconic representation of the determined audio sources.

As shown in FIG. 6 there can be displayed more than one of these representations, however in some embodiments the switching can be a toggling or cycling through available audio sources with the next to be selectable being displayed. The switch user interface visualizer 251 can for example generate a first representation 501 of a microphone in a box or window with an arrow pointing towards the microphone to indicate that by selecting this representation an external microphone can be selected. Similarly the switch user interface visualizer 251 can for example generate a second representation 503 of a mobile phone or electronic device in a box or window with an arrow pointing towards the device to indicate that by selecting this representation an integral or internal microphone can be selected. It would be understood that in some embodiments switch user interface visualizer 251 can be configured to output a visualization which enables a user to distinguish between not only whether the audio source is internal (mobile phone representation) or external (microphone representation) but the type of the audio source (for example an array of microphones can be represented by an icon showing multiple microphones, a FM source by a transistor radio icon or the letters FM or the logo or representation of the FM signal, an internal mp3 source by the letters mp3, an internally stored source by an icon representing the coding used on the audio signal for example the ogg vorbis logo for ogg vorbis encoded audio signals, a network streaming audio source by a streaming icon or the logo or representation of the streaming service for example the NOKIA Comes with Music icon when streaming from OVI music, a T-coil source by the known T-coil hearing aid icon, a NFC source by a loop icon). Furthermore it would be understood that the visualisations produced by the switch user interface visualizer 251 could be used in some embodiments by other visualizer components to assist the user in determining which source or control is to be selected and/or operated.

The user interface display 111 can be any suitable display technology configured to receive the visual representations from the parameter/signal visualizer 105 and display the representation to the user. An example of a suitable display technology could be but not exclusively one of LCD, LED, OLED. Furthermore in some embodiments the user interface 15 comprises an user interface input 113 suitable for receiving selections and other user input operations. In the herein examples the user interface input 113 is a touch screen input associated with the user interface display, however it would be appreciated that the user interface input 113 could be any one or combination of keypad, keyboard, joystick, trackpad, and in some embodiments be separate from the display.

The user interface input 113 can thus in some embodiments receive an input from the user, for example the user can select the displayed representation of the switch user interface first representation 501. The input can be detected and passed to the user interface input processor 107.

In some embodiments the apparatus comprises an user interface input processor 107. The user interface input processor 107 can be configured to receive inputs from the user interface input, process these input signals and generate control signals to be passed to the audio source controller 101. In the switching user interface example, the user interface input processor 107 receives from the user interface input 113 an indication that the user has selected the first representation 501 associated with the external microphone audio source. The user interface input processor 107 can then in such embodiments generate a switch control signal indicating the external microphone and pass the signal to the audio source controller 101.

The determination of a control input from the user interface is shown in FIG. 10 by step 907.

In other words in some embodiments the apparatus may further comprise means for interacting with the visual representation of the audio source, where the means for interacting with the visual representation of the audio source may comprise at least one of: means for selecting the visual representation; and means for moving the visual representation on the display. For example in some embodiments the user could manually move the estimated position of the external microphone so it better matches the accurate position. Furthermore in some embodiments although a 2D display is described it would be understood that the same apparatus and methods could be applied to the determination, visualization in 3D and control of audio sources.

In some embodiments the audio source controller 101 comprises control modules configured to receive control signals from the user interface input processor 107 and process the detected audio sources dependent on these control signals. Thus for example in some embodiments the audio source controller comprises a switch control module 104 configured to route or switch the audio source signals. Thus in the switching user interface example the switch control module 104 can receive a control input from the user interface input processor 107 and dependent on the control input, which in this example is an indicator to select the external microphone audio source, the switch control module 104 is configured to route the external microphone audio source to an output (which for this example can be the audio codec 103) for further processing and/or storage and/or transmission.

In some embodiments the audio source controller 101 comprises a mixer module 106. The mixer module 106 in a manner similar to the switch module can be configured to receive the detected audio source audio signals and apply a gain and/or mixing to the signals dependent on the control signals received from the UI input processor. Any suitable gain and/or mixing apparatus can be implemented for example controllable analogue gain, controllable digital gain, time sample mixing, and frequency domain mixing.

In other words in at least one embodiment there comprises means for processing an audio signal associated with the at least one audio source dependent on interaction with the visual representation.

Furthermore in some embodiments the audio source controller 101 comprises a filter module 108. The filter module 108 can be configured to receive the detected audio source audio signals and apply a frequency dependent gain to the signals dependent on the control signals received from the UI input processor 107. Any suitable frequency dependent gain apparatus can be implemented by the filter module 108, for example analogue filters, digital filters, time domain filtering, spatial filtering (for example for handling microphone arrays) and frequency domain filtering.

The operation of controlling the audio sources is shown in FIG. 10 by step 909.

In some embodiments the apparatus 10 comprises an audio codec 103. The audio codec 103 can be configured to receive at least one audio signal and encode or decode it into a suitable form. For example the audio codec 103 can be configured to encode a received audio signal and generate a form suitable for storage in memory 22 or passing to a playback speaker 33. The audio codec 103 can be any suitable codec.

Although herein is described an example of selecting one of the detected audio sources for the operation of capturing the audio signal it would be understood that more complex switching operations could be implemented by using such representations. For example in some embodiments the switch user interface visualizer 251 could be configured to generate a visualization allowing the selection of the output to direct the source to a specific memory, or to output the source directly to playback. In other words the means for processing an audio signal associated with the at least one audio source may comprise at least one of: means for switching the audio signal; means for filtering the audio signal; and means for amplifying the audio signal. Furthermore it would be understood that the means for filtering the audio signal may comprise at least one of: means for frequency filtering the audio signal; means for time filtering the audio signal; and means for spatial filtering the audio signal.

In some embodiments the parameter/signal visualizer 105 can in some embodiments comprise an audio sub-menu user interface visualizer 253. The audio sub-menu user interface visualizer 253 can in some embodiments be configured to generate a visual representation for enabling control of audio sources (for example an internal or external microphone).

With respect to FIGS. 7a to 7d examples of visual representations generated by the audio sub-menu user interface visualizer 253 are shown.

Figure 7A:
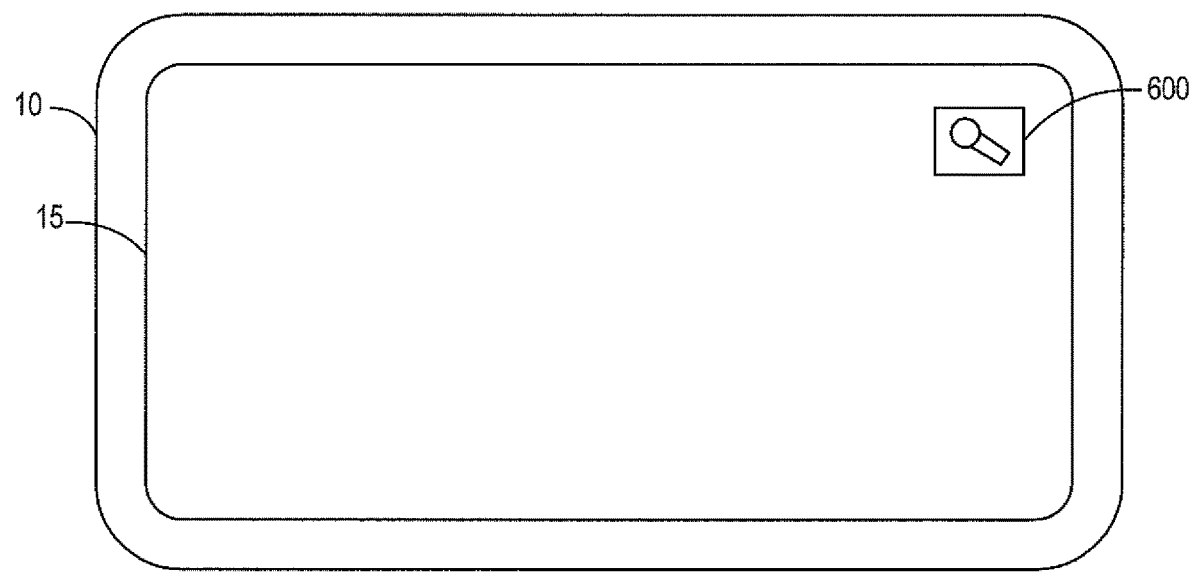
FIG. 7a shows an example of an audio sub-menu user interface indicator according to some embodiments.

The audio sub-menu user interface visualizer 253 can be configured for example as shown in FIG. 7a to generate a first sub-menu representation 600 on the display. The first sub-menu visual representation 600 can be in some embodiments a representation of a microphone in a box or window to indicate that by selecting this representation a sub-menu can be displayed. The first sub-menu visual representation 600 can be considered to be a 'closed' representation which is configured to 'open' when selected or interfaced with.

In a manner as described above the first sub-menu visual representation 600 can in some embodiments be interfaced with by selecting the representation, for example by touching the display within a region defined by the representation. The UI input 113 can then in such embodiments pass the touch selection to the UI input processor 107. In some embodiments rather than the UI input processor 107 passing the control signal to the audio source controller 101 the UI input processor 107 is configured to pass a control signal to the parameter/signal visualizer 105. In such embodiments the control signal can be used by the parameter/signal visualizer to change the representation passed to the display. Thus for example in the sub-menu window example by selecting or touching the sub-menu visual representation 600, the UI input 113 passes the 'touch' input to the UI input processor 107 which provides a control signal to the audio sub-menu user interface visualizer 253 to open up the sub-menu visual representation (or if open to close the sub-menu visual representation).

Figure 7B:
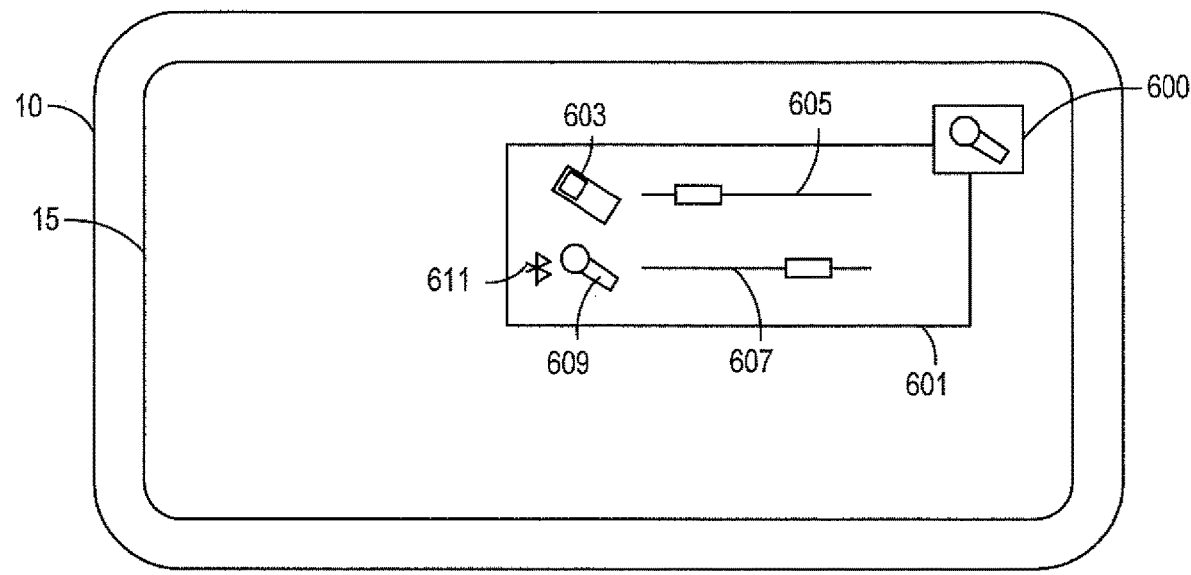
FIG. 7b shows an example of an audio sub-menu user interface configuration showing mixing between internal microphone and external microphone inputs.

With respect to FIG. 7b an example of an 'open' audio sub-menu user interface representation is shown. The 'open' audio sub-menu user interface representation comprises the first sub-menu visual representation 600 and a further 'open' or information window 601 within which information and control of the various audio sources can be implemented. Thus the audio sub-menu user interface visualizer 253 can be configured in some embodiments to generate the information window 601 comprising iconic representations of available audio sources and their associated characteristics.

Thus for example in FIG. 7b the audio sub-menu user interface visualizer 253 can generate an Iconic representation of the internal microphone (a mobile device icon) 603 and associated with the visual representation of the internal microphone 603 a visual representation of the gain applied to the audio signal received from the internal microphone shown by a slider visual representation 605. In some embodiments the user can interact with either the visual representation of the microphone so that in some embodiments by 'touching' or 'tapping' the visual representation or selecting the representation the audio source controller 104 can toggle switching the microphone audio signal input on and off. In some embodiments by 'long tapping' the visual representation the UI input processor can be configured to control the visualizer to display further information on the source such as the type of source, the format of the audio signal from the source, and the time stamp of the source. In some embodiments by 'touching' (for example by moving the slider position along the track) the slider visual representation associated with the microphone or visual representation the UI input processor 107 can be configured to control the filter 108 and/or mixer 106 to change the gain applied to the audio signal. In some further embodiments the slider can be a 2D representation of the frequency dependent gain applied to the signal and thus in such embodiments by interacting with the 2D representation and/or changing the shape of the envelope of the slider a control signal can be passed to the filter module 108 of the audio source controller 101 to apply a different frequency dependent gain.

As also shown in FIG. 7b more than one audio source can be displayed in the further 'open' or information window 601. In such embodiments the audio sub-menu user interface visualizer 253 can generate further iconic representations representing further audio sources, for example of external microphone (a microphone icon) 609. In some embodiments audio sub-menu user interface visualizer 253 can generate visual representations or icons associated with the displayed further audio sources, for example the BLUETOOTH short-range wireless icon 611 indicating that the external microphone is wireless and connected via a BLUETOOTH short-range wireless coupling to the apparatus. Other representations reflecting wired, or other wireless couplings can be generated in some embodiments. The further iconic representations can further be associated with their associated audio signal characteristics, such as shown in FIG. 7b by the further slider 607.

It would be understood that where the display permits the audio sub-menu user interface visualizer 253 can generate coloured or shaded visual representations where the colour or shade can indicate further parameters or characteristics associated with the audio source. For example a detected microphone which is on standby can have a visual representation with a first colour or shading pattern, a microphone which is on and sending audio signals can have a visual representation with a second colour or shading pattern. Other visual tools such as transparency, blinking can also in some embodiments be used to convey information about the audio source.

Figure 7C:
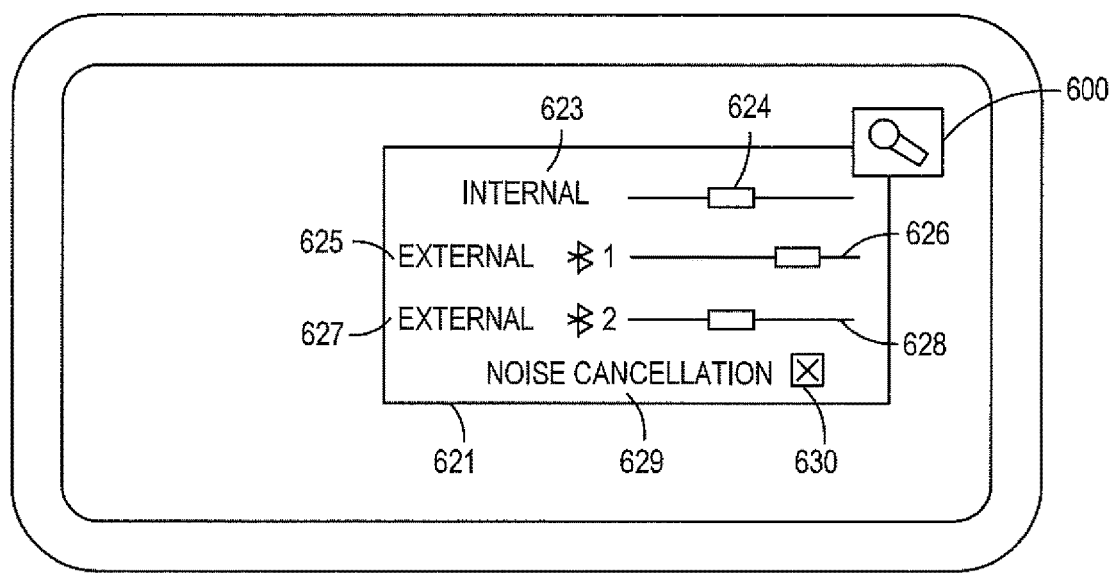
FIGS. 7c and 7d show examples of an audio sub-menu user interface configuration showing mixing between three microphone inputs.

With respect to FIG. 7c a further example of an example of an 'open' audio sub-menu user interface representation is shown. The audio sub-menu user interface visualizer 253 in this example is configured to generate visual representation of the audio sources defined by labels rather than icons or pictures. Thus for example the internal microphone is visually represented by the label 'INTERNAL' 623 and has an associated slider 624 showing the associated gain applied to the internal microphone audio signal. Also generated can be visual representations associated with external microphones such as a first external microphone visually represented by the label 'EXTERNAL' 625, indicating an external microphone, the symbol for a BLUETOOTH short-range wireless coupling and the label '1' indicating it is the first external microphone. Furthermore the external microphone audio source gain can be visually represented by and controlled by use of a visual representation of a further slider 626. Furthermore a second external microphone can be represented by the label EXTERNAL 627, indicating an external microphone, the symbol for a BLUETOOTH short-range wireless coupling and the label '2' indicating it is the second external microphone. Furthermore the second external microphone audio source gain can be visually represented by and controlled by use of a visual representation of a further slider 628.

Furthermore in some embodiments the parameter/signal visualizer 105 (and the audio sub-menu user interface visualizer 253) can be configured to generate visual representations enabling further information or control options, such as shown in FIG. 7*c* by the example option label 'NOISE CANCELATION' 629 and a selection or tick box 630 indicating the status of the noise cancellation operation. In such embodiments by selecting either the label or selection box the option in question can be selected is currently de-selected or de-selected if currently selected. It would be understood that other effects or filtering to be applied to all of the selected audio sources could be controlled using the option label embodiment similar to that described above. Thus in some embodiments there can be a visual representation for a 'global' muting where all detected and/or determined audio sources are muted. In some other embodiments a noise reduction option can be controlled by the interaction with a visual representation for a label 'NOISE REDUCTION'.

Although the above label visual representations are in English it would be understood that any other suitable language or text label can be used in some embodiments of the application.

Figure 7D:
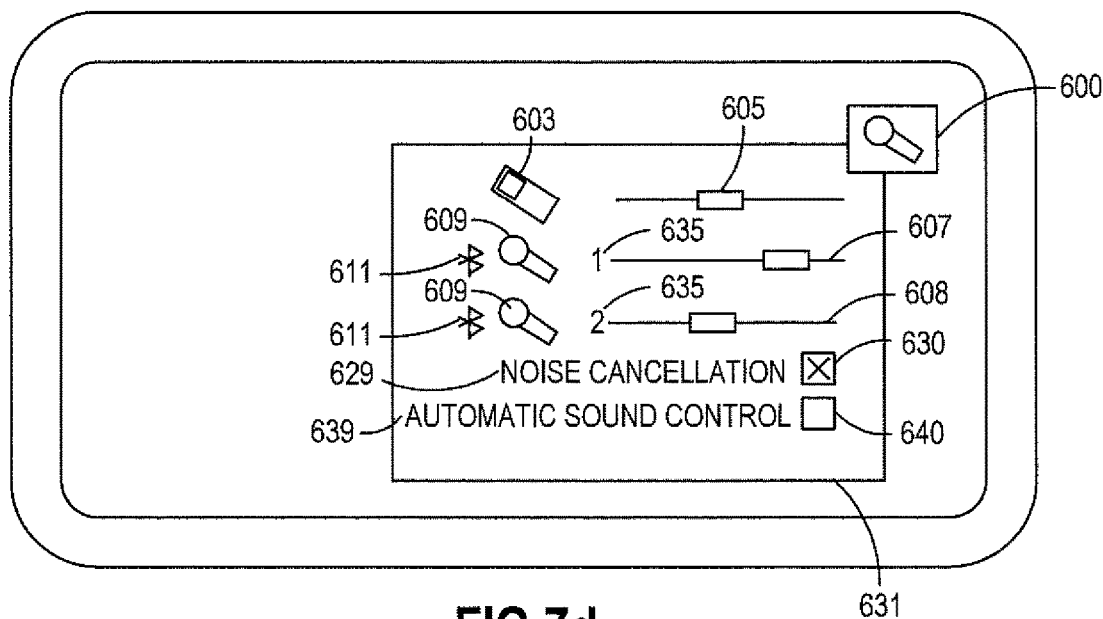

With respect to FIG. 7*d* a further example of an example of an 'open' audio sub-menu user interface representation is shown whereby both iconic representations and labels are used to provide information and options to the user. For example the iconic or pictorial representations shown in FIG. 7*b* are used to represent the type of the audio source, internal or external, and their coupling to the apparatus with a numerical label 633, 635 identifying each of the type. Also the label representations of the options associated with the audio sources 'NOISE CANCELLATION' 629 and 'AUTOMATIC SOUND CONTROL' 639 representing information on the use or processing of the audio sources.

In some embodiments the parameter/signal visualizer 105 can in some embodiments comprise an advanced audio control user interface visualizer 255. The advanced audio control user interface visualizer 255 can in some embodiments be configured to generate visual representations for enabling control of audio sources (for example an internal or external microphone).

With respect to FIGS. 8*a* to 8*j* examples of visual representations generated by the advanced audio control user interface visualizer 255 are shown.

Figure 8A:
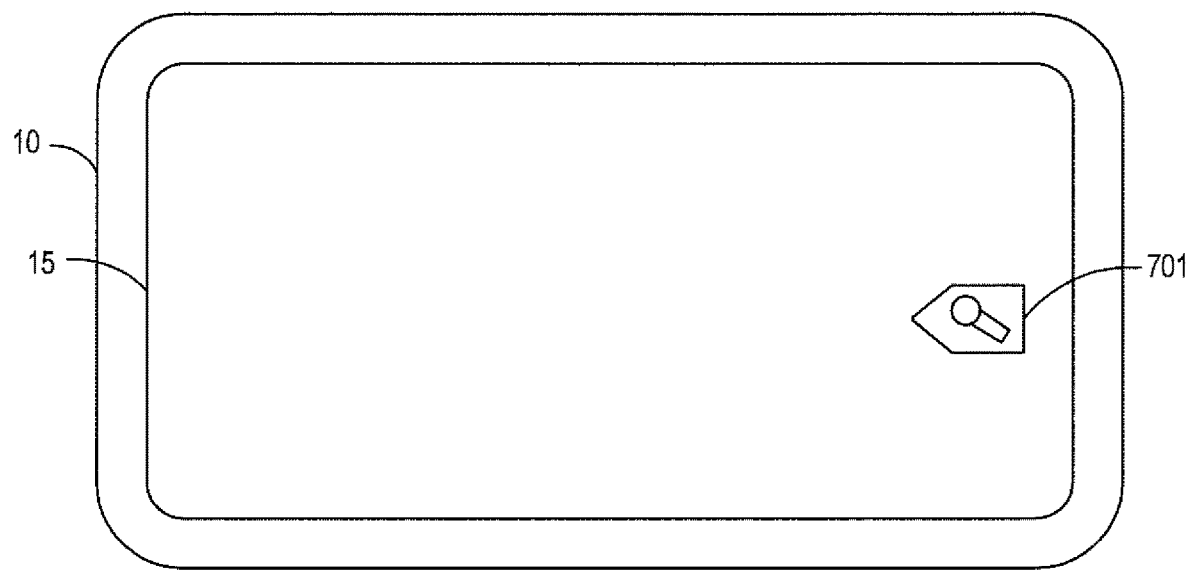
FIG. 8a shows an example of an audio control user interface indicator.

The advanced audio control user interface visualizer 255 can be configured for example as shown in FIG. 8*a* to generate a first advanced audio control UI representation 701 on the display. The first advanced audio control UI representation 701 can be in some embodiments a representation of a microphone in an arrow shaped window with the arrow pointing inwards to indicate that by selecting this representation advanced audio UI controls can be displayed. The advanced audio control UI representation 701 can be considered to be a 'closed' representation which is configured to 'open' when selected or interfaced with. It would be understood that in other embodiments the activation of the advanced audio UI controls could be implemented without a specific advanced audio control UI visual representation change, or could be a change other than that described above such as colour, shading, or effect. Furthermore it would be understood that any transition described herein and represented by a visual representation change could be represented by an audio representation, such as an audio clip or sound being output and/or a haptic representation of a change such as a physical movement of the apparatus or display.

In a manner as described above the first advanced audio control UI representation 701 can in some embodiments be interfaced with by selecting the representation, for example by touching the display within a region defined by the representation. The UI input 113 can then in such embodiments pass the touch selection to the UI input processor 107. In some embodiments as well as the U I input processor 107 passing the control signal to the audio source controller 101 the UI input processor 107 is configured to pass a control signal to the parameter/signal visualizer 105. In such embodiments the control signal can be used by the parameter/signal visualizer to change the representation passed to the display. Thus for example in the advanced audio control UI representation example by selecting or touching the advanced audio control UI representation 701, the UI input 113 passes the 'touch' input to the U I input processor 107 which provides a control signal to the advanced audio control user interface visualizer 255 to open up the advanced UI audio control visual representation (or if open to close the advanced UI audio control visual representation).

Figure 8B:
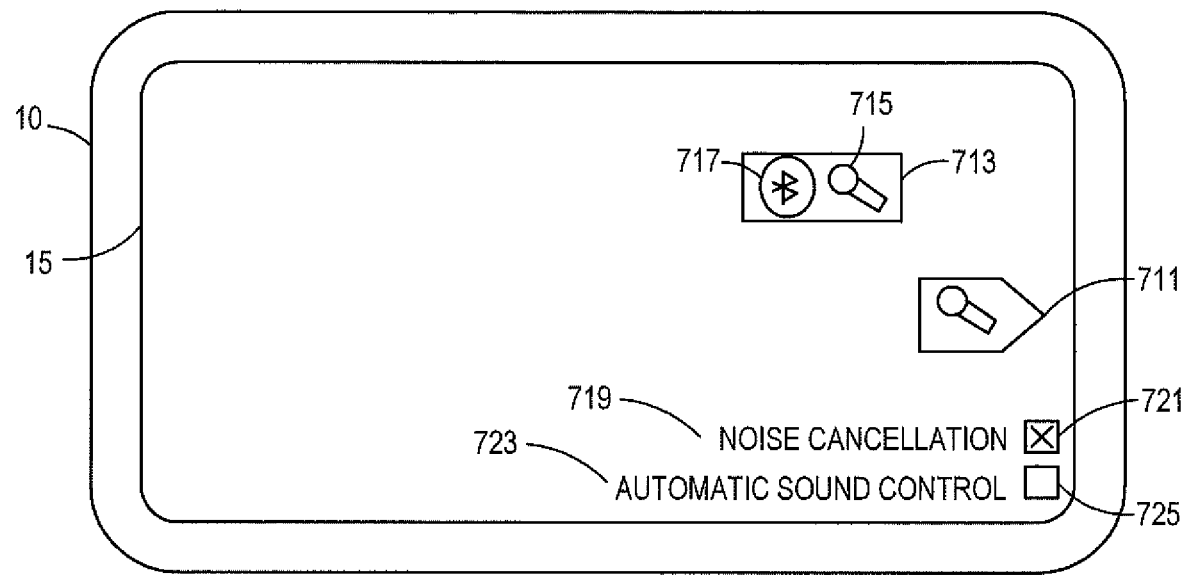
FIGS. 8b and 8c show examples of an audio control user interface configuration for controlling microphone inputs.

With respect to FIG. 8*b* an example of an 'open' advanced UI audio control visual representation is shown. The 'open' advanced UI audio control visual representation in this example comprises an 'open' advanced UI audio control visual representation 711, shown as a microphone in an arrow similar to that shown in the 'closed' advanced UI audio control visual representation but with the direction of the arrow reversed to point to the right rather than the left and further 'open' or information windows within which information and control of the various audio sources can be implemented.

The examples shown with respect to the advanced UI audio control visual representations in FIGS. 8*b* to 8*j* show each audio source as a window 713 located within which are indicators associated with each source. In some embodiments advanced audio control user interface visualizer 255 generates a visual representation representing the type of audio source (for example an external microphone audio source shown by the pictorial representation of a microphone 715) and furthermore the characteristics of the audio source (for example the BLUETOOTH short-range wireless representation 717).

Figure 8C:
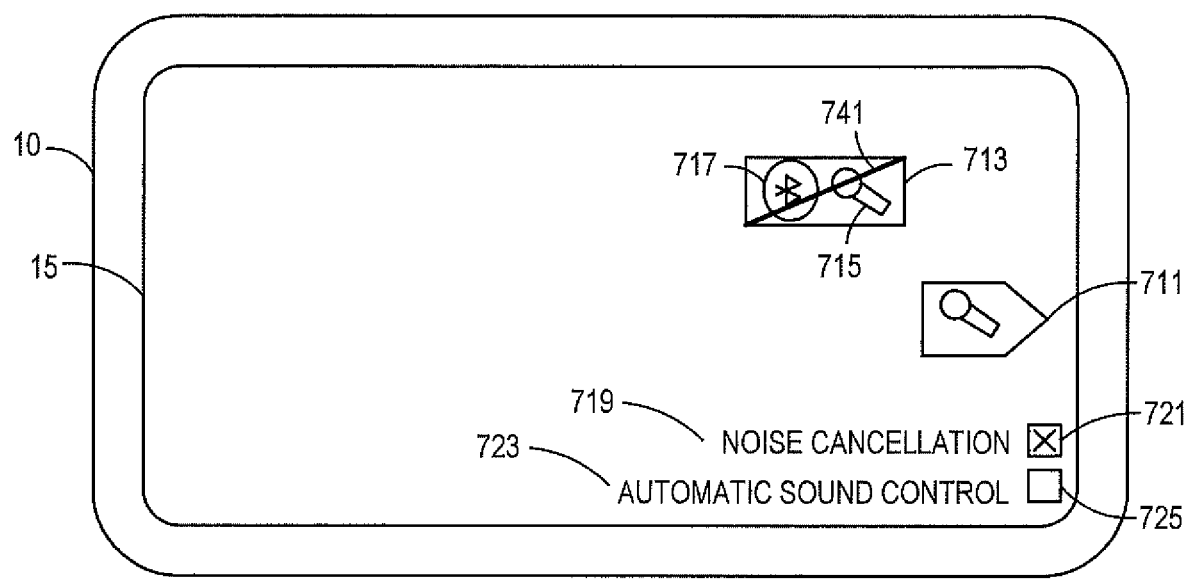
Figure 8D:
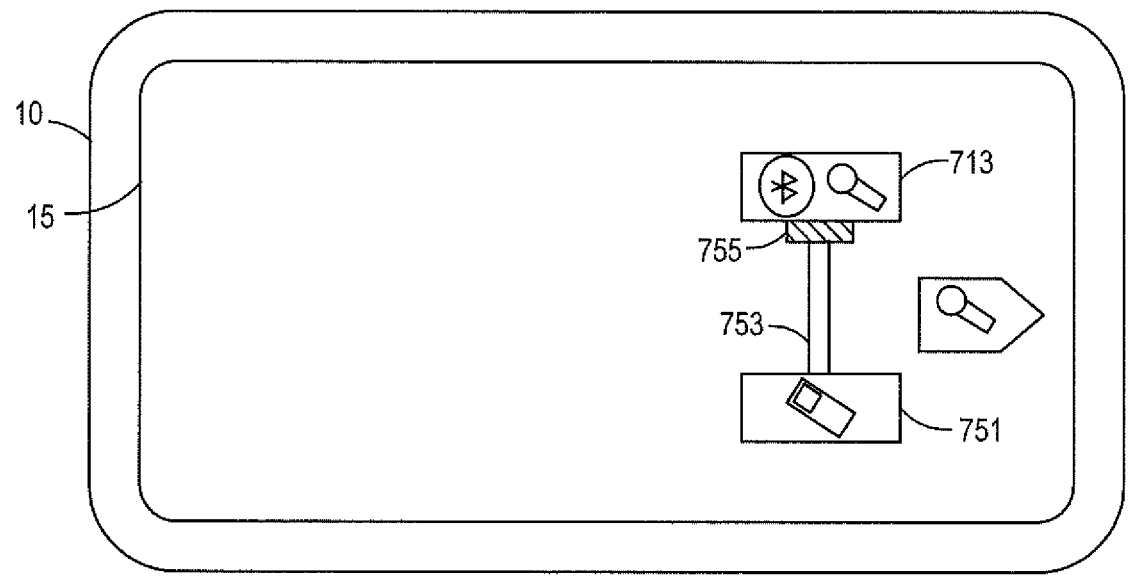
FIG. 8d shows an example of an audio control user interface configuration showing a slider mixing control between an external and internal microphone input.

Furthermore as shown in FIGS. 8*b* and 8*c*, the advanced audio control user interface visualizer 255 can in some embodiments generate visual representations to display and/or enable control of information with regards to the processing or control of the audio signals. For example the advanced audio control user interface visualizer 255 can in some embodiments generate 'NOISE CANCELLATION' 629 and 'AUTOMATIC SOUND CONTROL' 639 labels with associated toggle, tick or selection boxes 721 and 725 representing information on the use or processing of the audio sources.

In some embodiments the advanced audio control user interface visualizer 255 can by the colour or shading of the box 713 indicate the gain being applied to the audio signal received from the audio source represented by the visual representation. Thus in some embodiments a green colour indicates a 100% input gain, an amber colour a 50%-99% input gain and a red input a 0%-49% input gain. In some embodiments such as shown in FIG. 8*c* the advanced audio control user interface visualizer 255 indicate an activation or deactivation of the audio source by a 'bar' visual representation 741. As described herein by interacting with the audio source box 713, such as by touching the visual representation of the audio source box on the display, the UI input determines the touch and the UI input processor 107 on receiving the detected touch of the audio source box 713 can be configured to control both the toggling of the audio source by controlling the switch module 104 and/or audio source controller 101 and also controlling the parameter/signal visualizer to apply or to remove the 'bar' visual representation. It would be understood that shading and/or colour schemes could further be implemented to indicate the operational status of the audio source, for example changing the colour of the audio source box visual representation from green to red on selecting the audio source to be not received or processed.

In some embodiments the advanced audio control user interface visualizer 255 can be configured to generate a visual representation reflecting the relative proportions of two audio sources used in mixing by generating a first audio source box 713 and a second audio source box 751 linked by a visual representation of a track or rod 753 on which a slider visual representation 755 indicates of the relative gain applied in the mixer module 106 mixing the audio signals from each of the sources. Thus for example in FIG. 8d the slider is substantially indicative that the audio source input is that received from the external BLUETOOTH microphone as the slider is a substantially closer to the BLUETOOTH short-range wireless microphone or first audio source box visual representation 713 than the second or internal microphone audio source box visual representation 751.

It would be understood that in such embodiments the mixing can be changed by interfacing with the slider 755, for example touching and sliding a finger along the visual representation of the track or rod 753. Furthermore it would be appreciated that in some embodiments the advanced audio control user interface visualizer 255 can implement colour or shading schemes to further indicate to the user the current proportions of the audio signal being applied to the mix.

Figure 8E:
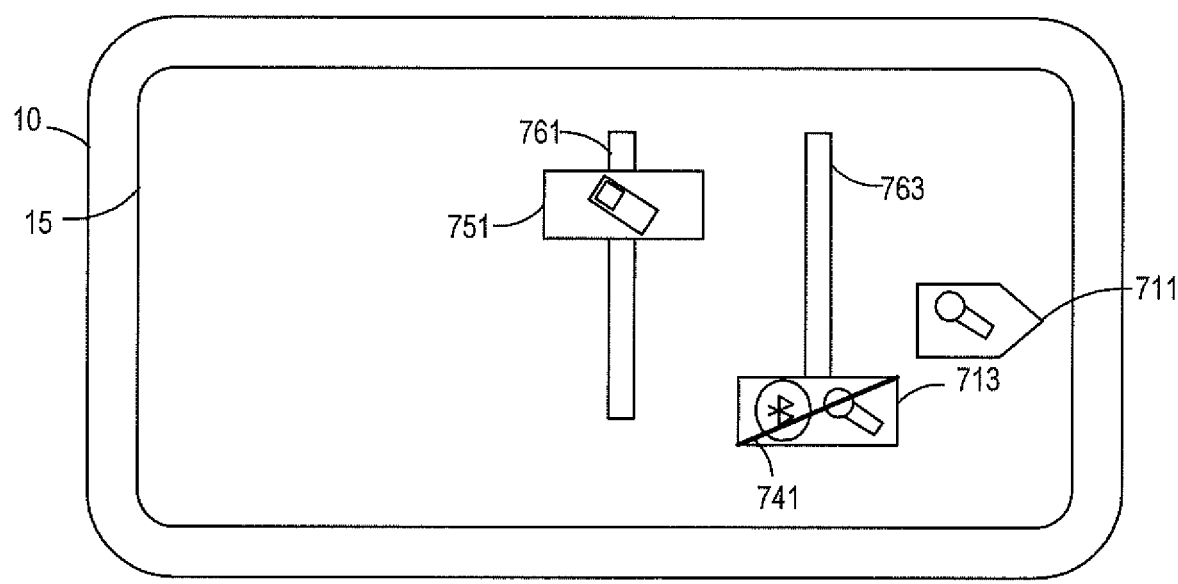
FIGS. 8e, and 8f show examples of an audio control user interface configuration showing a two slider mixing control controlling the selection of an external and internal microphone input.
Figure 8F:
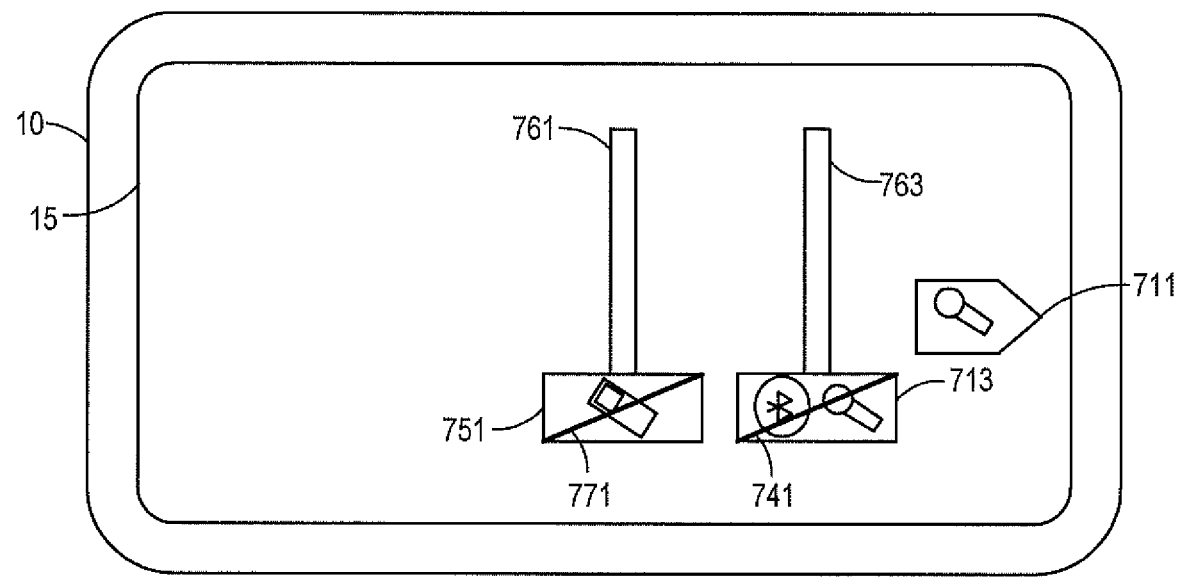
Figure 8G:
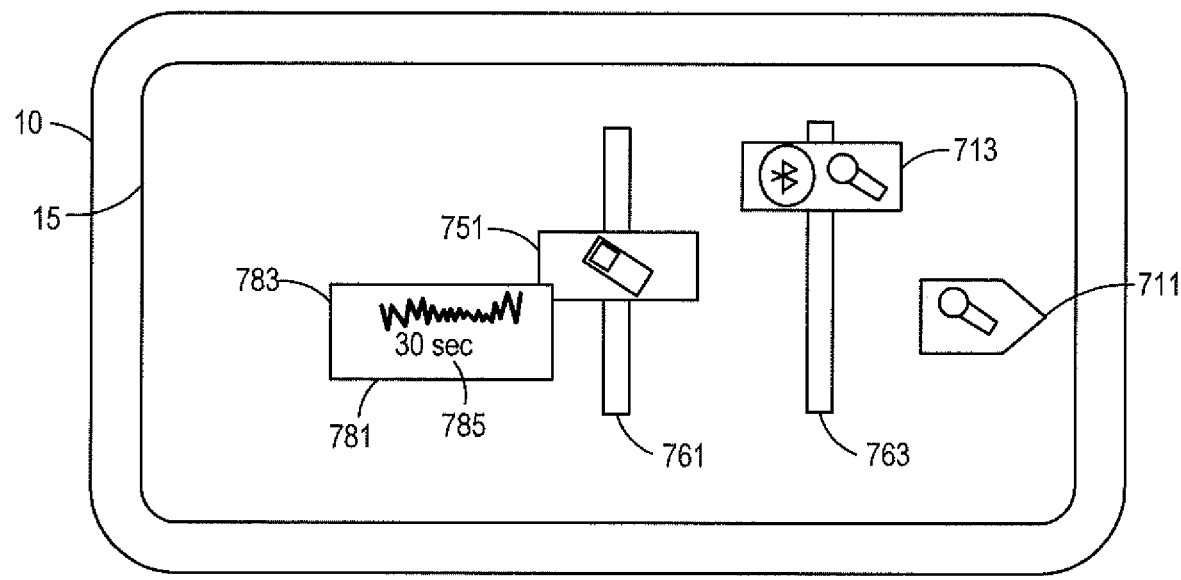
FIG. 8g shows an example of an audio control user interface configuration showing a two slider mixing control with displayed input signal history.
Figure 8H:
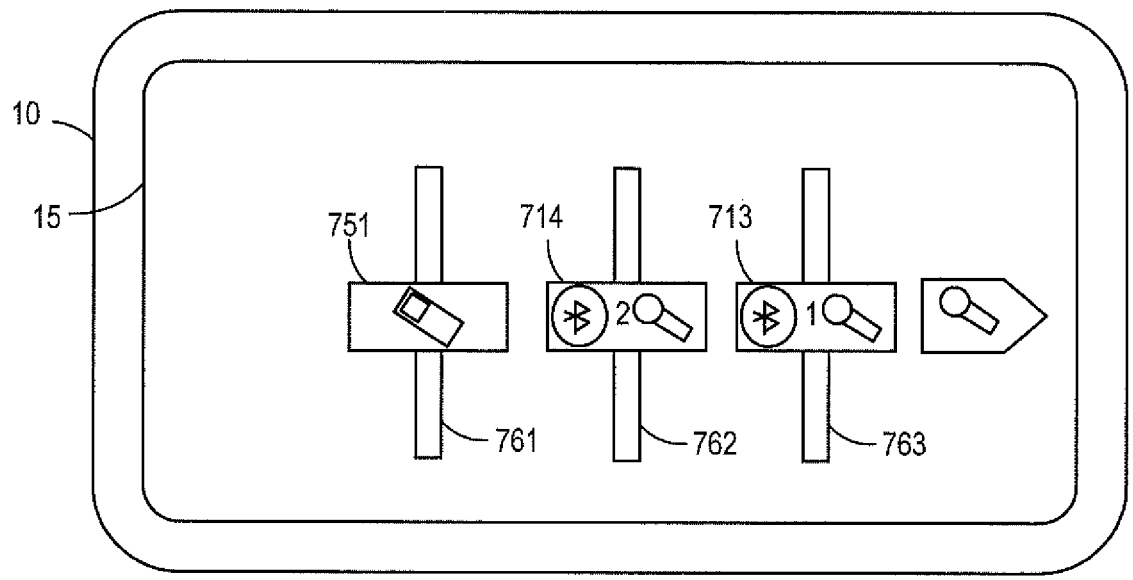
FIGS. 8h, 8i, and 8j show examples of audio control user interface configuration controlling the mixing of three audio inputs.
Figure 8I:
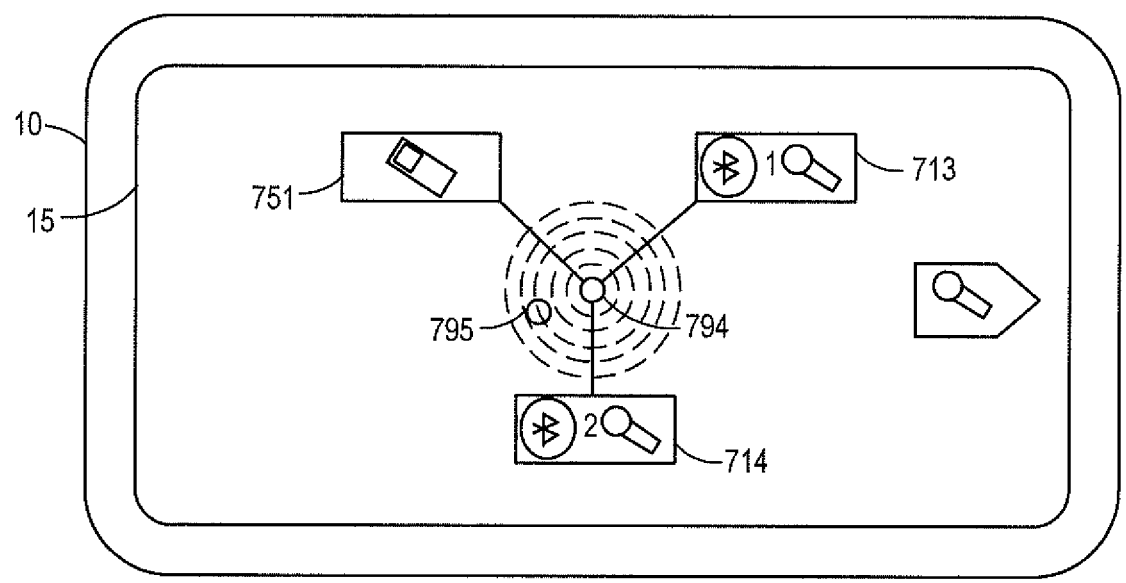

In some embodiments the advanced audio control user interface visualizer 255 can be configured to generate visual representations whereby each audio source box is located on a track or rod providing control of each audio source audio signal. For example as shown in FIG. 8e each audio source box 713, 751 is a virtual slider on a respective track or rod 763, 761 the position along the rod providing or representing a control signal for mixing the detected and displayed audio signals. Thus the user can 'fade' both audio sources to zero by interfacing with each audio source box, in other words moving the audio source box to the bottom of the track or rod as shown in FIG. 8f. Furthermore as the input of the audio source signal reaches zero the advanced audio control user interface visualizer 255 can generate visual representation bars 741, 771 to be applied to the audio source boxes 713, 751.

In some embodiments more than one interaction or interfacing mode can be applied to each audio source. As described herein by 'moving' the audio source box on the track or rod the gain or relative gain can of the audio signal associated with each audio source can be controlled. However in some embodiments of the application by interacting but not moving the audio source box a further operation can be carried out. In such embodiments the further operation can be to display characteristics about the audio signal. With respect to FIG. 8g such an example is shown. For example in some embodiments by selecting the audio source box a sub-window 781 can be generated by the advanced audio control user interface visualizer 255 within which can be displayed a time domain representation 783 of the audio signal associated with the audio source and a label '30 sec' 785 indicating the time span of the time domain representation. In some further embodiments the advanced audio control user interface visualizer 255 can in dependent of the user interface control processor signal generate a frequency domain representation. In some embodiments the interaction with the audio source box further controls the period of the domain representation, so that the longer the box is 'touched' the longer the period displayed.

In some embodiments the advanced audio control user interface visualizer 255 can generate visual representations for more than two audio sources. With respect to FIG. 8h a first example is shown which is similar to the examples shown in FIGS. 8e to 8g where each audio source has its own rod or track on which a visual representation of the audio source, the audio source boxes 713, 714, 751 are sliders controlling the gain applied at the mixer module 106 to the associated audio signals. With respect to FIG. 8i a further example is shown which is similar to the example shown in FIG. 8d where each audio source is represented by an audio box and the audio boxes are coupled together by a series of visual representation of rods with a central point 794 representing the control signal where all signals are mixed equally. The control of the gain of applied at the mixer module 106 in such examples can be implemented by a virtual slider 795 operating between the audio source boxes.

Figure 8J:
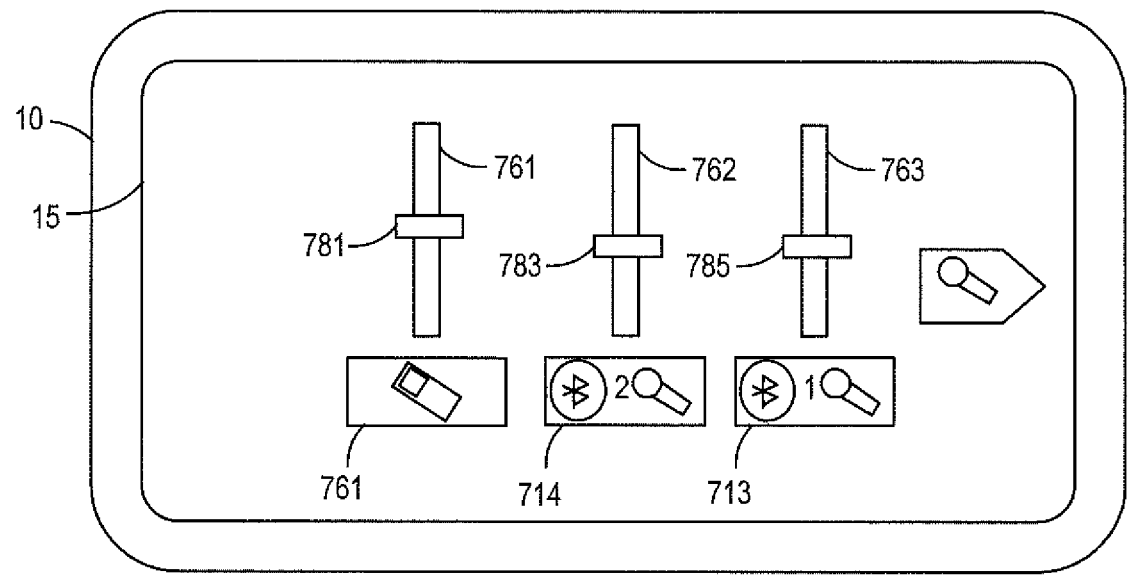

With respect to FIG. 8j another visual representation example is shown whereby the audio source boxes 713, 714, and 751 are each associated with a rod or track 761, 762, 763 and on each rod or track representation is a slider 781, 783 785 configured to be interacted or interfaced with. Thus for example in such embodiments the mixing/filtering control can be configured to be dependent on the interaction of the position of the slider on the track and information on the audio source control can be configured to be dependent on interaction with the audio box. Although the example with respect to FIG. 8j shows three audio sources it would be understood that any suitable number of audio sources can be represented.

Figure 9:
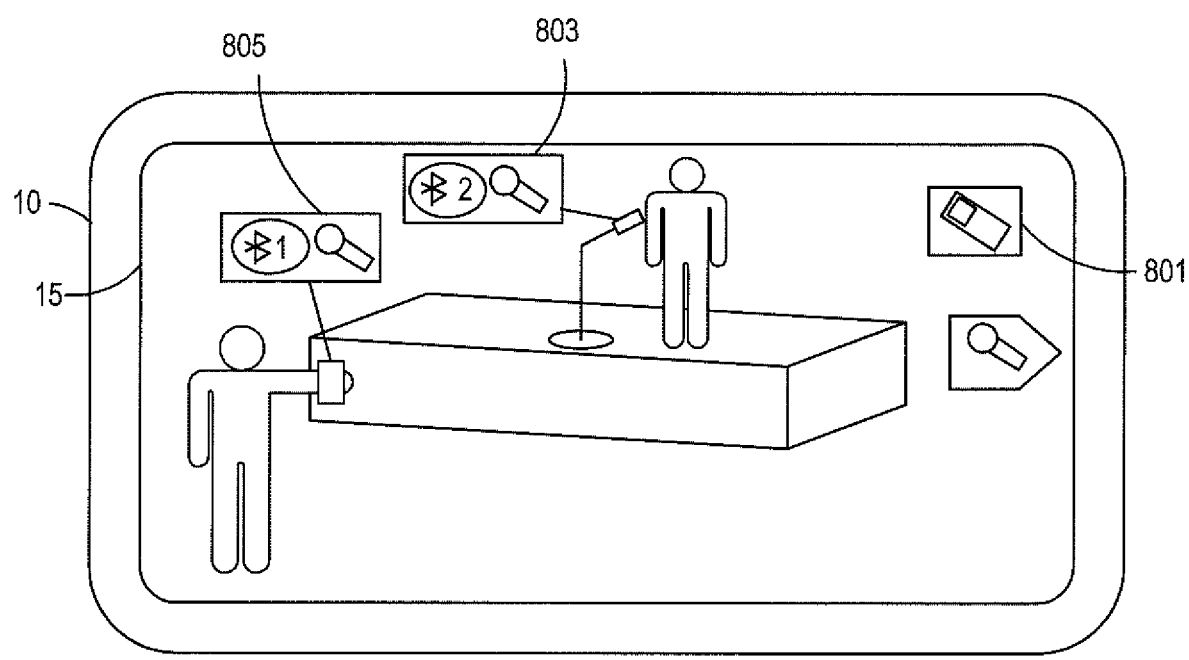
FIG. 9 show an augmented reality view configuration suitable in embodiments of the application.

In some embodiments the advanced audio control user interface visualizer 255 can generate the visual representations such that they overlie other images. For example in some embodiments the UI 15 is configured to display an image taken using a camera, the advanced audio control user interface visualizer 255 is configured based on the detected audio source information provided from the sensors and processed by the audio source controller audio source determiner 102 associate each detected audio source with a position in the image taken from the camera. Thus for example as shown in FIG. 9, the image of a concert taken by the camera is overlaid with a first audio source box 801 representing the apparatus or devices internal microphone, a second audio source box 803 representing the external microphone of the vocalist, and a third audio source box 805 representing the external microphone of a further apparatus or device located nearer the stage than the apparatus. In such a manner it would be possible to select or mix between the audio signals received from each audio source to capture a better audio signal. In other words in some embodiments there can comprise means for displaying the visual representation dependent on the position of the at least one audio source.

Figure 4:
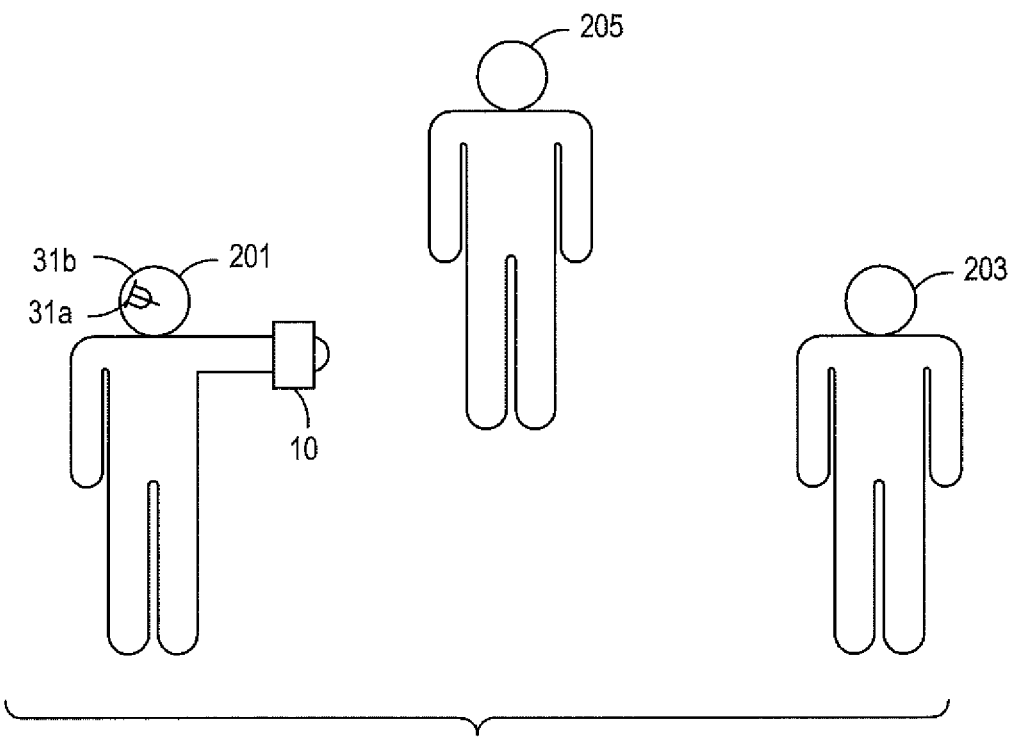
FIG. 4 shows schematically the apparatus being used for interviewing according to some embodiments.
Figure 5A:
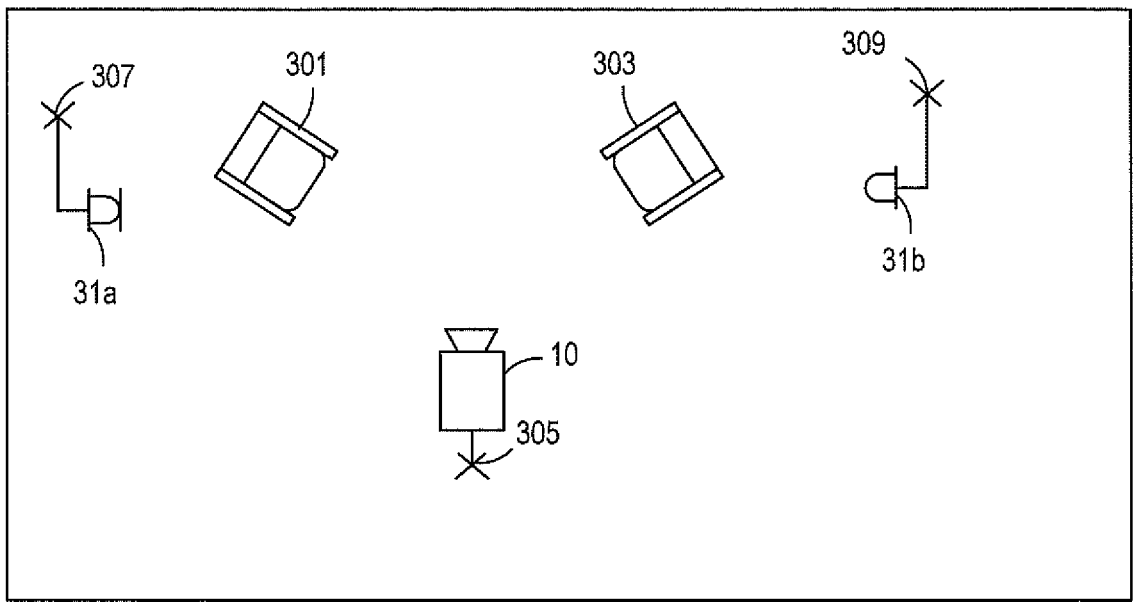
FIG. 5a shows schematically the apparatus being in a studio interview in a first arrangement according to some embodiments.

Further examples of the implementation of embodiments of the application can be seen in FIGS. 4 and 5a/5b. In the example shown in FIG. 4 an interviewer 201 can be equipped with suitable audio/video recording apparatus 10 according to embodiments of the application. The interviewer 201 can furthermore be equipped with a BLUETOOTH short-range wireless device with microphones 31a and 31b which can be detected by the apparatus audio source determiner and controlled with respect to the visual representations generated by the parameter/signal visualizer such that mixing the audio sources enables the interviewer 201 to interview the interviewees 203, 205.

Figure 5B:
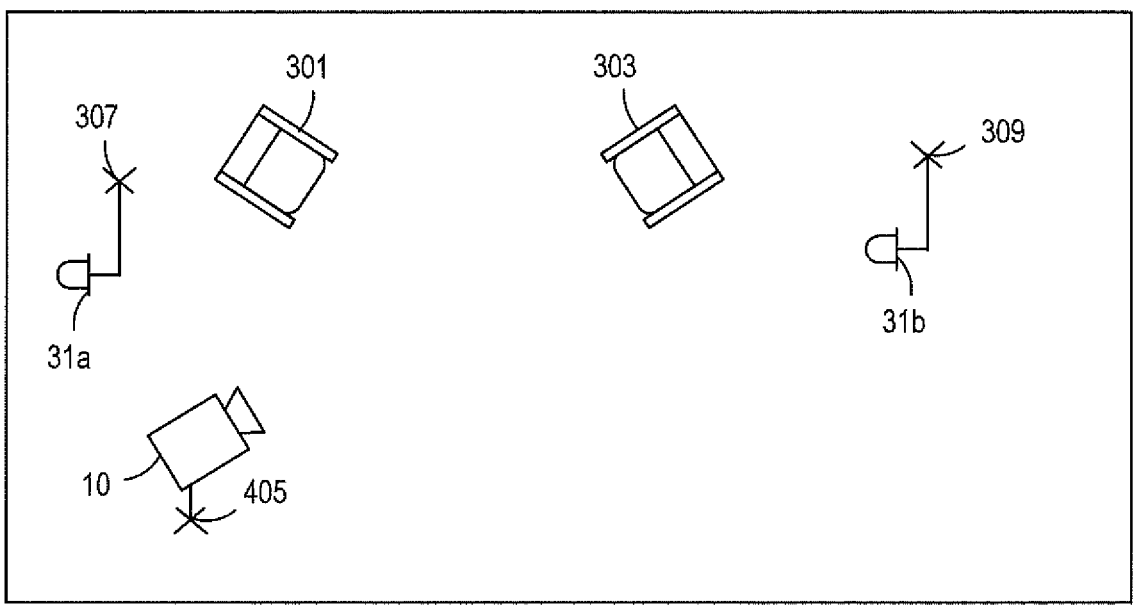
FIG. 5b shows schematically the apparatus being used in a studio interview in a second arrangement according to some embodiments.

In the examples shown in FIGS. 5a and 5b a studio style operation can be shown where the apparatus 10 is located at position 1 305 in FIG. 5a and in position 2 in FIG. 5b and is configured to receive audio signals from external microphones 31a and 31b at microphone position 1 307 and position 2 309 respectively. In both examples the microphone signals can be monitored and mixed directed on the apparatus 10 thus overcoming the need for sophisticated and expensive mixing equipment.

Although the above examples describe embodiments of the invention operating within an electronic device 10 or apparatus, it would be appreciated that the invention as described below may be implemented as part of any audio processor.

Thus, for example, embodiments of the invention may be implemented in an audio processor which may implement audio processing over fixed or wired communication paths.

Thus user equipment may comprise an audio processor such as those described in embodiments of the invention above.

It shall be appreciated that the term electronic device and user equipment is intended to cover any suitable type of wireless user equipment, such as mobile telephones, portable data processing devices or portable web browsers.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Therefore in summary there is in at least one embodiment an apparatus comprising: an audio source determiner configured to determine at least one audio source; a visualizer configured to generate a visual representation associated with the at least one audio source; and a controller configured to process an audio signal associated with the at least one audio source dependent on interaction with the visual representation.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

Thus at least one embodiment comprises a computer-readable medium encoded with instructions that, when executed by a computer perform: determining at least one audio source; generating a visual representation associated with the at least one audio source; and processing an audio signal associated with the at least one audio source dependent on interaction with the visual representation.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, California and Cadence Design, of San Jose, California automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

As used in this application, the term 'circuitry' refers to all of the following:
(a) hardware-only circuit implementations (such as implementations in only analog and/or digital circuitry) and
(b) to combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone or server, to perform various functions and
(c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An apparatus for audio capture comprising:
   at least one processor; and
   at least one memory storing instructions that, when executed with the at least one processor, cause the apparatus at least to:
      receive a plurality of audio signals from a plurality of microphones, wherein the plurality of microphones comprises at least one microphone that is implemented physically on the apparatus and at least one microphone that is not implemented physically on the apparatus, wherein at least one of the plurality of audio signals is received from the at least one microphone that is not implemented physically on the apparatus via a wireless connection;
      provide, at least, a visual representation with a user interface, wherein the apparatus comprises the user interface, wherein the user interface is configured to receive, at least, an interaction, wherein the visual representation is configured to indicate, at least, a first microphone usage for a first microphone of the plurality of microphones and a second microphone usage for a second microphone of the plurality of microphones for the audio capture; and
      control processing of, at least, the plurality of audio signals for the audio capture based, at least partially, on the received interaction, wherein the received interaction comprises an interaction with the visual representation, wherein the received interaction is configured to cause use of an audio signal of the plurality of audio signals for the processing of another audio signal of the plurality of audio signals, wherein the use of the audio signal comprises at least selection of one of:
         a first audio signal of the first microphone that is implemented physically on the apparatus, or
         a second audio signal of the second microphone that is not implemented physically on the apparatus,
      wherein the processing for the audio capture is performed within the apparatus, and wherein the audio capture comprises at least one of:
         noise reduction,
         noise cancellation, or
         a filtering operation.

2. The apparatus of claim 1, wherein the received interaction is configured to control at least one of: an analogue gain, or a digital gain, applied to at least one of: the first audio signal associated with the first microphone, or the second audio signal associated with the second microphone.

3. The apparatus of claim 1, wherein the received interaction is configured to cause at least one of:
   a first gain to be applied to the first audio signal of the plurality of audio signals associated with the first microphone, or
   a second gain to be applied to the second audio signal of the plurality of audio signals associated with the second microphone, wherein the second gain is smaller than the first gain.

4. The apparatus of claim 1, wherein the visual representation comprises:
   a first visual representation related to the first microphone, and
   a second visual representation related to the second microphone.

5. The apparatus of claim 4, wherein the visual representation comprises:
   a visual representation of a slider between the first visual representation and the second visual representation,
   wherein the controlling of the processing of the plurality of audio signals for the audio capture is based on a position of the visual representation of the slider between the first visual representation and the second visual representation.

6. The apparatus of claim 5, wherein the received interaction is configured to move the visual representation of the slider relative to the first visual representation and the second visual representation.

7. The apparatus of claim 4, wherein the visual representation comprises:
   a third visual representation related to a third microphone of the plurality of microphones, and
   at least one visual representation related to a gain,
   wherein the first visual representation, the second visual representation, and the third visual representation are in an arrangement configured to visually indicate that the first audio signal associated with the first microphone, the second audio signal associated with the second microphone, and a third audio signal associated with the third microphone are to be used for the processing of the plurality of audio signals for the audio capture,
   wherein the at least one visual representation related to the gain is configured to indicate the gain applicable to the first audio signal, the second audio signal, and the third audio signal,
   wherein the received interaction comprises an interaction with the at least one visual representation related to the gain and is configured to modify the gain.

8. The apparatus of claim 1, wherein the visual representation is configured to indicate a proportion of the plurality of audio signals used in the processing.

9. The apparatus of claim 8, wherein the proportion of the plurality of audio signals is indicated via at least one of: a color scheme, or a shading scheme.

10. The apparatus of claim 1, wherein the received interaction is configured to cause at least one of:
    the first microphone usage, or
    the second microphone usage
    to be zero for the processing.

11. The apparatus of claim 1, wherein the filtering operation comprises at least one of: a frequency filtering operation, a time filtering operation, or a spatial filtering operation.

12. The apparatus of claim 1, wherein the received interaction is configured to control at least one of: the first microphone usage, or the second microphone usage.

13. A method comprising:
    receiving, with an apparatus for audio capture, a plurality of audio signals from a plurality of microphones, wherein the plurality of microphones comprises at least one microphone that is implemented physically on the apparatus and at least one microphone that is not implemented physically on the apparatus, wherein at least one of the plurality of audio signals is received from the at least one microphone that is not implemented physically on the apparatus via a wireless connection;

providing, at least, a visual representation with a user interface, wherein the apparatus comprises the user interface, wherein the user interface is configured to receive, at least, an interaction, wherein the visual representation is configured to indicate, at least, a first microphone usage for a first microphone of the plurality of microphones and a second microphone usage for a second microphone of the plurality of microphones for the audio capture; and controlling processing of, at least, the plurality of audio signals for the audio capture based, at least partially, on the received interaction, wherein the received interaction comprises an interaction with the visual representation, wherein the received interaction is configured to cause use of an audio signal of the plurality of audio signals for the processing of another audio signal of the plurality of audio signals, wherein the use of the audio signal comprises at least selection of one of:

a first audio signal of the first microphone that is implemented physically on the apparatus, or a second audio signal of the second microphone that is not implemented physically on the apparatus, wherein the processing for the audio capture is performed within the apparatus, and wherein the audio capture comprises at least one of:
noise reduction,
noise cancellation, or
a filtering operation.

14. The method of claim 13, wherein the received interaction is configured to cause at least one of:

a first gain to be applied to the first audio signal of the plurality of audio signals associated with the first microphone, or a second gain to be applied to the second audio signal of the plurality of audio signals associated with the second microphone, wherein the second gain is smaller than the first gain.

15. The method of claim 13, wherein the visual representation comprises:

a first visual representation related to the first microphone,
a second visual representation related to the second microphone, and
a visual representation of a slider between the first visual representation and the second visual representation, wherein the controlling of the processing of the plurality of audio signals for the audio capture is based on a position of the visual representation of the slider between the first visual representation and the second visual representation.

16. The method of claim 13, wherein the received interaction is configured to cause at least one of:
the first microphone usage, or
the second microphone usage
to be zero for the processing.

17. The method of claim 13, wherein the received interaction is configured to control at least one of: the first microphone usage, or the second microphone usage.

18. A non-transitory computer-readable medium comprising program instructions stored thereon for performing at least the following:

causing receiving, for audio capture, of a plurality of audio signals from a plurality of microphones, wherein the plurality of microphones comprises at least one microphone that is implemented physically on an apparatus and at least one microphone that is not implemented physically on the apparatus, wherein at least one of the plurality of audio signals is received from the at least one microphone that is not implemented physically on the apparatus via a wireless connection;

causing providing of, at least, a visual representation with a user interface, wherein the apparatus comprises the user interface, wherein the user interface is configured to receive, at least, an interaction, wherein the visual representation is configured to indicate, at least, a first microphone usage for a first microphone of the plurality of microphones and a second microphone usage for a second microphone of the plurality of microphones for the audio capture; and controlling processing of, at least, the plurality of audio signals for the audio capture based, at least partially, on the received interaction, wherein the received interaction comprises an interaction with the visual representation, wherein the received interaction is configured to cause use of an audio signal of the plurality of audio signals for the processing of another audio signal of the plurality of audio signals, wherein the use of the audio signal comprises at least selection of one of:

a first audio signal of the first microphone that is implemented physically on the apparatus, or a second audio signal of the second microphone that is not implemented physically on the apparatus, wherein the processing for the audio capture is performed within the apparatus, and wherein the audio capture comprises at least one of:
noise reduction,
noise cancellation, or
a filtering operation.

* * * * *